United States Patent
Pham et al.

(10) Patent No.: US 12,279,534 B2
(45) Date of Patent: Apr. 15, 2025

(54) SPIN INJECTION SOURCE, MAGNETIC MEMORY, SPIN HALL OSCILLATOR, COMPUTER, AND MAGNETIC SENSOR

(71) Applicant: TOKYO INSTITUTE OF TECHNOLOGY, Tokyo (JP)

(72) Inventors: Nam Hai Pham, Tokyo (JP); Takanori Shirakura, Tokyo (JP); Tsuyoshi Kondo, Kawasaki Kanagawa (JP)

(73) Assignee: INSTITUTE OF SCIENCE TOKYO, Tokyo (JP)

( * ) Notice: Subject to any disclaimer, the term of this patent is extended or adjusted under 35 U.S.C. 154(b) by 317 days.

(21) Appl. No.: 17/894,167

(22) Filed: Aug. 24, 2022

(65) Prior Publication Data
US 2023/0063084 A1 Mar. 2, 2023

(30) Foreign Application Priority Data
Aug. 31, 2021 (JP) .................... 2021-141316

(51) Int. Cl.
| | | |
|---|---|---|
| H10N 50/10 | (2023.01) | |
| G11C 11/16 | (2006.01) | |
| H10B 61/00 | (2023.01) | |
| H10N 50/85 | (2023.01) | |
| H10N 52/00 | (2023.01) | |
| H10N 52/80 | (2023.01) | |

(52) U.S. Cl.
CPC .......... *H10N 50/10* (2023.02); *G11C 11/161* (2013.01); *H10B 61/22* (2023.02); *H10N 50/85* (2023.02); *H10N 52/00* (2023.02); *H10N 52/80* (2023.02)

(58) Field of Classification Search
CPC ........ H10N 50/10; H10N 50/85; H10N 52/00; H10N 52/80; G11C 11/161; G11C 11/1673; G11C 11/1675; H10B 61/22
See application file for complete search history.

(56) References Cited

U.S. PATENT DOCUMENTS

| | | | |
|---|---|---|---|
| 2012/0161209 A1 | 6/2012 | Yazdani et al. | |
| 2018/0337326 A1 | 11/2018 | Sasaki | |
| 2020/0266336 A1* | 8/2020 | Nakada | ............... H01F 10/14 |
| 2020/0279992 A1 | 9/2020 | Pham et al. | |
| 2021/0125653 A1 | 4/2021 | Sonobe et al. | |

(Continued)

FOREIGN PATENT DOCUMENTS

| | | |
|---|---|---|
| JP | 2019165244 A | 9/2019 |
| JP | 2021072138 A | 5/2021 |

(Continued)

OTHER PUBLICATIONS

Japanese Office Action (and an English language translation thereof) dated Jun. 18, 2024, issued in counterpart Japanese Application No. 2021-141316.

(Continued)

*Primary Examiner* — Allison Bernstein
(74) *Attorney, Agent, or Firm* — Holtz, Holtz & Volek PC

(57) ABSTRACT

According to one embodiment, a spin injection source comprising a half Heusler alloy-topological semi-metal that has a surface state of Dirac type and that is in contact with a ferromagnet. The half Heusler alloy-topological semi-metal supplies a spin current to the ferromagnet based on a current flowing in a direction parallel to a first surface that is in contact with the ferromagnet.

34 Claims, 13 Drawing Sheets

Sample 1

(56) References Cited

U.S. PATENT DOCUMENTS

2021/0265562 A1* 8/2021 Ichikawa ............... H10N 50/10
2022/0060149 A1* 2/2022 Pham ................... G01R 33/098

FOREIGN PATENT DOCUMENTS

| JP | 2021082841 A | 5/2021 | |
|---|---|---|---|
| WO | 2019054484 A1 | 3/2019 | |
| WO | WO-2020179493 A1 * | 9/2020 | ........... G01R 33/093 |

OTHER PUBLICATIONS

Hosen, et al., "Observation of Dirac state in half-Heusler material YPtBi", Scientific Reports, 2020, Jan. 7, 2023, vol. 10, No. I,DOI: 10.1038/s41598.

Logan, et al., "Observation of a topologically non-trivial surface state in half/Heusler PtLuSb (001) thin films", Nature Communications, 2016, vol. 7, No. 1, DOI:10.1038/ncomms11993.

Dc, et al., "Room-Temperature High Spin-Orbit Torque Due to Quantum Confinement in Sputtered $Bi_xSe_{(1-x)}$ Films", Nature Materials, vol. 17, p. 800-p. 807, Sep. 2018.

Liu, et al., "Spin-Torque Ferromagnetic Resonance Induced by the Spin Hall Effect", Physical Review Letters 106, 036601, Jan. 20, 2011.

Liu, et al., "Spin-Torque Switching with the Giant Spin Hall Effect of Tantalum", Science, vol. 336, p. 555-p. 558, May 4, 2012.

Mellnik, et al., "Spin-transfer Torque Generated by a Topological Insulator", Nature, vol. 511, 2014, p. 449-p. 451, Jul. 24, 2014.

Pai, et al., "Spin Transfer Torque Devices Utilizing the Giant Spin Hall Effect of Tungsten", Applied Physics Letters 101, 122404, published online Sep. 18, 2012.

Wu, et al., "Room-Temperature Spin-Orbit Torque from Topological Surface States", Physical Review Letters 123, 207205, Nov. 15, 2019.

* cited by examiner

Sample 1

Sample 2

| Material | $\theta_{SH}$ (CoTb) | Intrinsic $\theta_{SH}$ |
|---|---|---|
| Ta | −0.031 | −0.15 |
| Pt | 0.017 | 0.08 |
| $Bi_2Se_3$ | 0.16 | 2~3.5 |
| $(Bi, Sb)_2Te_3$ | 0.4 | 2.5 |
| BiSb | 3.4 | 52 |
| YPtBi | 0.25 | 1.4 |
F I G. 10
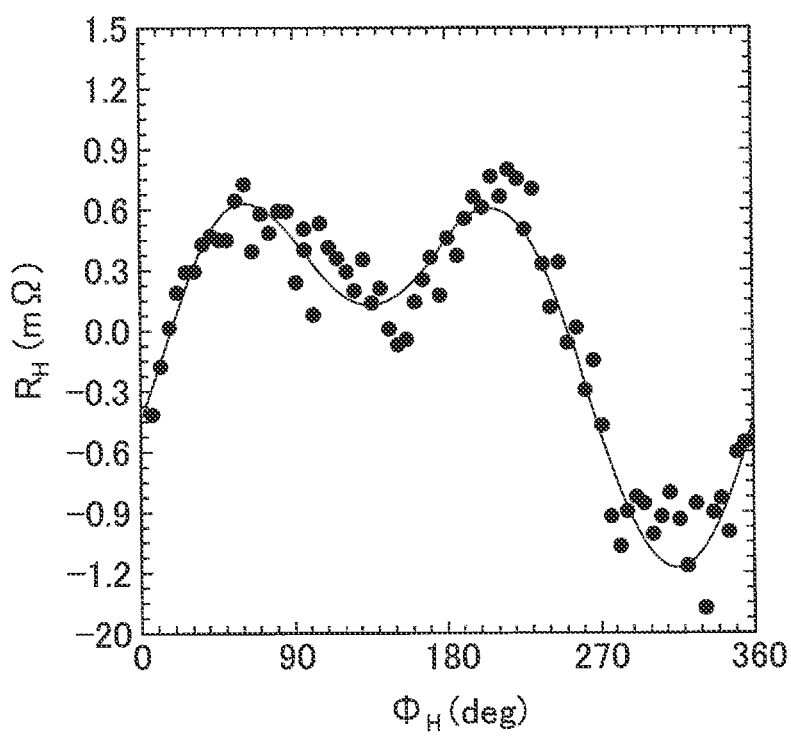
F I G. 11

| Kind of material | Material | $|\theta_{SH}|$ | $\sigma$ (S/m) | Normalized power consumption |
|---|---|---|---|---|
| Heavy metals | Ta | 0.15 | $5.3 \times 10^5$ | 1 |
| | Pt | 0.08 | $4.2 \times 10^6$ | $3.6 \times 10^{-1}$ |
| | W | 0.4 | $4.7 \times 10^5$ | $1.6 \times 10^{-1}$ |
| HHA-TSM | YPtBi | 1.3 | $1.57 \times 10^5$ | $3.3 \times 10^{-2}$ |

FIG. 12

| Property | Topological insulator | HHA-TSM |
|---|---|---|
| Heat resistance | 300°C | 600°C |
| Toxic material | Contained | Not contained |
| SHE | Stronger than heavy metal | Stronger than heavy metal |
| Electric conductivity | Relatively low | Relatively high |
| Surface roughness | 5–8 Å | About 2 Å |

FIG. 13

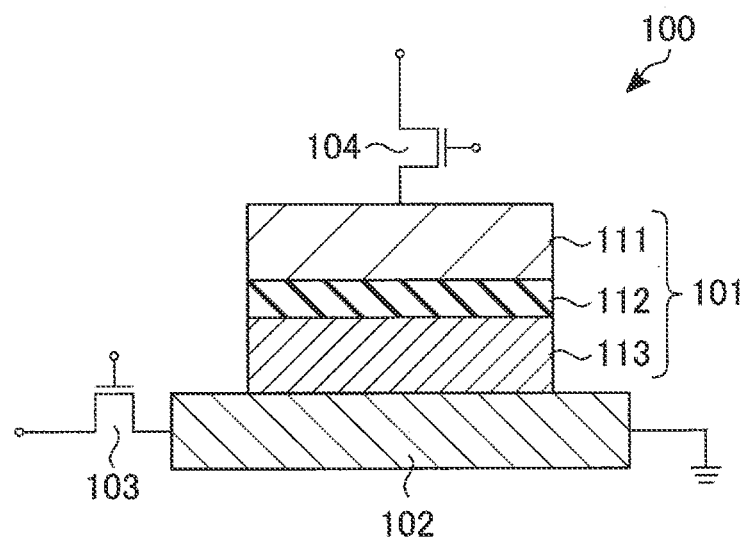
F I G. 14
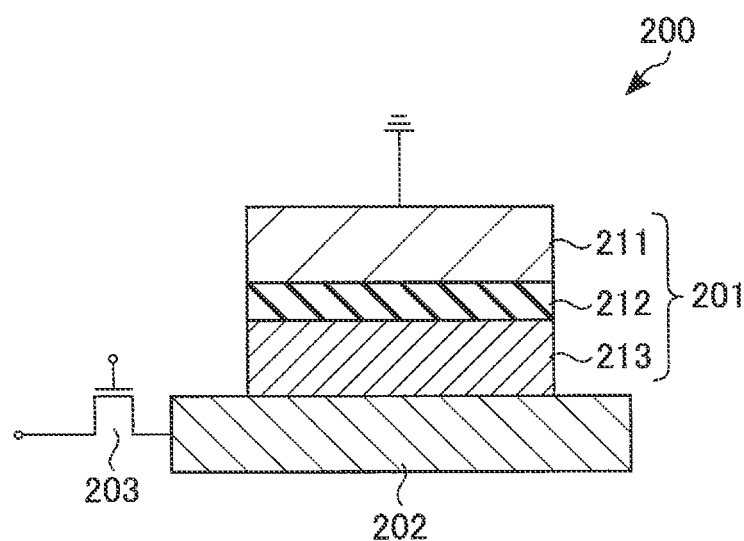
F I G. 15

SPIN INJECTION SOURCE, MAGNETIC MEMORY, SPIN HALL OSCILLATOR, COMPUTER, AND MAGNETIC SENSOR

CROSS-REFERENCE TO RELATED APPLICATION(S)

This application is based upon and claims the benefit of priority from Japanese Patent Application No. 2021-141316, filed Aug. 31, 2021, the entire contents of which are incorporated herein by reference.

FIELD

Embodiments described herein relate generally to a spin injection source, a magnetic memory, a spin Hall oscillator, a computer, and a magnetic sensor using topological material.

BACKGROUND

A ferromagnet exhibits a magnetoresistive effect in which its resistance value changes depending on a direction of magnetization. Therefore, application of a ferromagnet to a magnetic memory which records information utilizing the direction of magnetization of the ferromagnet has attracted public attention. As a large-capacity memory having a capacity exceeding that of a NAND flash memory, a magnetic memory of a domain wall motion type which utilizes domain wall motion of a ferromagnet has also attracted public attention. Furthermore, magnetization of a ferromagnet can precess at several GHz or higher. Therefore, application of a ferromagnet to a spin Hall oscillator, or a computer, such as a neuromorphic computer using the spin Hall oscillator, is also expected.

As one of base technologies of these devices, a technique for controlling the direction of magnetization of a ferromagnet is important. Of the methods to control magnetization, a method using a spin current, which is a current of a spin angular momentum of electrons, is the mainstream. Methods for generating a spin current are broadly classified into two.

A first method is to cause a current to flow through a ferromagnet and generate a spin polarized current by a spin filtering effect of the ferromagnet. With this method, the spin polarized current is caused to flow through the ferromagnet which is a target of control, so that the direction of magnetization of the ferromagnet can be controlled. This method is referred to as a spin transfer torque (STT) method. FIG. 1 illustrates an example of a cell structure of an STT magnetic memory (STT-magnetoresistive random access memory (STT-MRAM)) as an example to which the STT method is applied. The STT magnetic memory has a structure in which a nonmagnetic insulator functioning as a tunnel barrier layer is provided between a ferromagnet having a magnetization as a control target (magnetization free layer) and a ferromagnet for generating a spin current (magnetization fixed layer). By causing the current to flow in a direction perpendicular to a film surface of the ferromagnet, a spin current is generated in a direction parallel to the current. At this time, the spin current generation efficiency depends on a spin polarization P of a ferromagnetic material used in the magnetization fixed layer. However, the spin polarization P is generally as small as 0.5 to 0.8, and cannot exceed 1 in principle. Thus, the STT magnetic memory requires a large current for magnetization control. Magnetization control using a large current has been one of the causes for deterioration of devices. The problem that a large current is required for magnetization control is inherent in the STT method, and is common to all devices utilizing the STT method.

To solve the problem, a method utilizing a phenomenon called a spin Hall effect (SHE) has attracted public attention as a second method. The SHE is a phenomenon in which a spin current is generated in a direction perpendicular to a current injected into a nonmagnetic material. As a material having a strong SHE, a heavy metal and a topological insulator, in which a spin orbit interaction is strong, are known. These materials can be candidates for a spin injection source material. One method that utilizes the SHE is referred to as a spin orbit torque (SOT) method. FIG. 2 illustrates an example of a cell structure of an SOT magnetic memory (SOT-MRAM)) as an example to which the SOT method is applied. The SOT method includes a spin injection source (spin Hall layer) adjacent to the magnetization free layer in addition to a stacked structure like the STT method. In the SOT method, the direction of the current and the direction of the spin current are perpendicular. Thus, an effective spin current generation efficiency is based on a product of a spin Hall angle representing the strength of the SHE and the ratio $L_{FM}/t_{SH}$ of the length $L_{FM}$ of the magnetization free layer to the thickness $t_{SH}$ of the film of the spin Hall layer. Thus, the SOT method can improve the spin current generation efficiency by devising not only the spin Hall material but also a structure of the spin Hall layer. Furthermore, since both the spin Hall angle and the ratio $L_{FM}/t_{SH}$ can exceed 1, the amount of the current required for magnetization control can be easily reduced.

From the viewpoint of the spin current generation efficiency, it is desirable that the material of the spin Hall layer have a large spin Hall angle. On the other hand, since the spin Hall layer is in contact with the magnetization free layer, part of the current injected into the spin Hall layer is branched into the magnetization free layer. Therefore, it is desirable that the spin Hall material have an electric conductivity equal to or higher than that of the ferromagnetic material of the magnetization free layer. In terms of the magnitude of the magnetoresistive effect, a ferromagnet, such as a cobalt iron (CoFe) alloy, is used as a material of the magnetization free layer. It is preferable that the spin Hall material have an electric conductivity of $10^5$ S/m or higher.

As spin Hall materials having a high electric conductivity of $10^5$ S/m or higher, heavy metals, such as platinum (Pt), tantalum (Ta), and tungsten (W), have been studied. However, since the spin Hall angle of heavy metals is as small as 0.1 degrees or greater and less than 0.2 degrees, the effect of reducing the amount of the current for magnetization control is limited. As materials having a great spin Hall angle of 1 or greater, topological insulators, such as $Bi_2Se_3$ (Bi: bismuth, Se: selenium) and $Bi_2Te_3$ (Te: tellurium), are known. The large spin Hall angle of these materials results from a strong anti-damping torque generated from the surface state of Dirac type. These materials each have an electric conductivity as low as 103 to 104 S/m. However, a spin Hall angle greater than 1 is desirable in terms of the spin current generation efficiency. In recent years, a bismuth antimony (BiSb) alloy, which is a kind of topological insulator that can achieve both a high electric conductivity exceeding $10^5$ S/m and a great spin Hall angle greater than 1, has been developed. Using the BiSb alloy as the spin Hall material can reduce the amount of current for magnetization control by an order of magnitude or more as compared to that in the STT method.

The topological insulator has a spin Hall angle greater than 1 arising from the surface state of Dirac type. Therefore, the topological insulator can realize a spin current generation efficiency higher than in heavy metals. However, conventional topological insulators are mainly formed of group V and group VI elements with a low melting point. Thus, there is a problem in that current topological insulators have a low affinity for a semiconductor manufacturing process that involves heating to 400° C. or higher.

BRIEF DESCRIPTION OF THE DRAWINGS

FIG. 10 is a table showing a spin Hall angle measured by using cobalt terbium (CoTb) and a spin Hall angle, in which spin dissipation effect of CoTb has been corrected, with regard to various spin Hall materials including YPtBi.

FIG. 11 is a diagram showing a relationship between a Hall resistance and an in-plane application angle of a magnetic field according to the first embodiment.

FIG. 12 is a table showing an absolute value of a spin Hall angle, an electric conductivity, and a normalized power consumption of each spin Hall material.

FIG. 13 is a table showing a heat resistance, toxic material, an SHE, an electric conductivity, and surface roughness of topological insulators and a half Heusler alloy-topological semi-metal (HHA-TSM).

FIG. 14 is a schematic diagram showing an example of a cell structure of an SOT magnetic memory of three-terminal type according to a first example of the first embodiment.

FIG. 15 is a schematic diagram showing an example of a cell structure of an SOT magnetic memory of two-terminal type according to a second example of the first embodiment.

DETAILED DESCRIPTION

In general, according to one embodiment, a spin injection source comprising a half Heusler alloy-topological semi-metal that has a surface state of Dirac type and that is in contact with a ferromagnet. The half Heusler alloy-topological semi-metal supplies a spin current to the ferromagnet based on a current flowing in a direction parallel to a first surface that is in contact with the ferromagnet.

Hereinafter, embodiments will be described with reference to the drawings. In the description below, structural elements having the same functions and configurations will be denoted by a common reference symbol.

1. First Embodiment

A spin injection source and a magnetic memory using yttrium platinum bismuth (YPtBi), which is a half Heusler alloy-topological semi-metal (HHA-TSM), as a spin Hall material, will be explained below.

1.1 Properties of YPtBi

First, properties of YPtBi, as an example of the HHA-TSM, are explained. The material of the HHA-TSM is not limited to YPtBi. For example, the HHA-TSM is a ternary alloy or a mixed crystal that is comprised of two kinds of transition metals or rare earths and one kind of a representative element, and that has a half Heusler structure and a topological surface state. More specifically, for example, the HHA-TSM may be an alloy or a mixed crystal of LuPtSb, LuPdBi, LuPtBi, ScPtBi, YAuPb, LaPtBi, CePtBi, ThPtPb, and LaAuPb (Lu: lutenium, Pt: platinum, Sb: antimony, Pd: palladium, Bi: bismuth, Sc: scandium, Y: yttrium, Au: gold, Pb: lead, La: lanthanum, Ce: cerium, Th: thorium).

1.1.1 Heat Resistance

Figure 1:
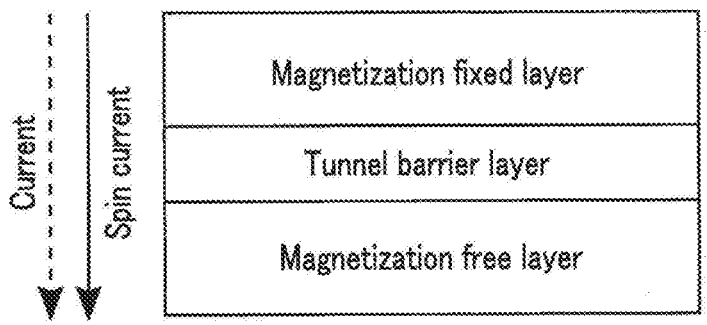
FIG. 1 is a schematic view showing an example of a cell structure of a magnetic memory of an STT method.
Figure 2:
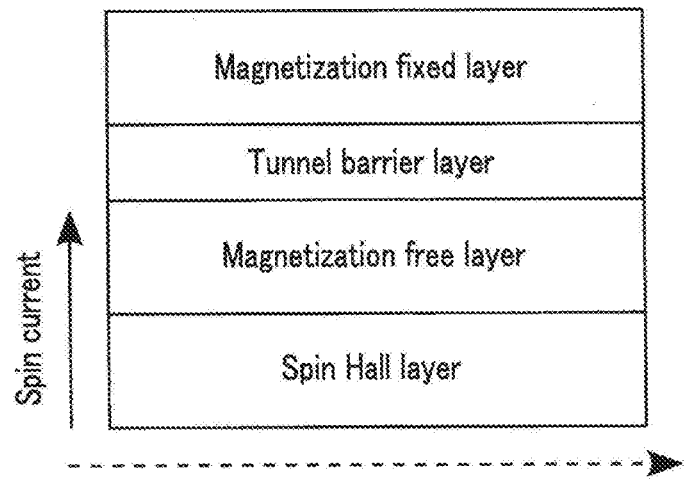
FIG. 2 is a schematic view showing an example of a cell structure of a magnetic memory of an SOT method.
Figure 3:
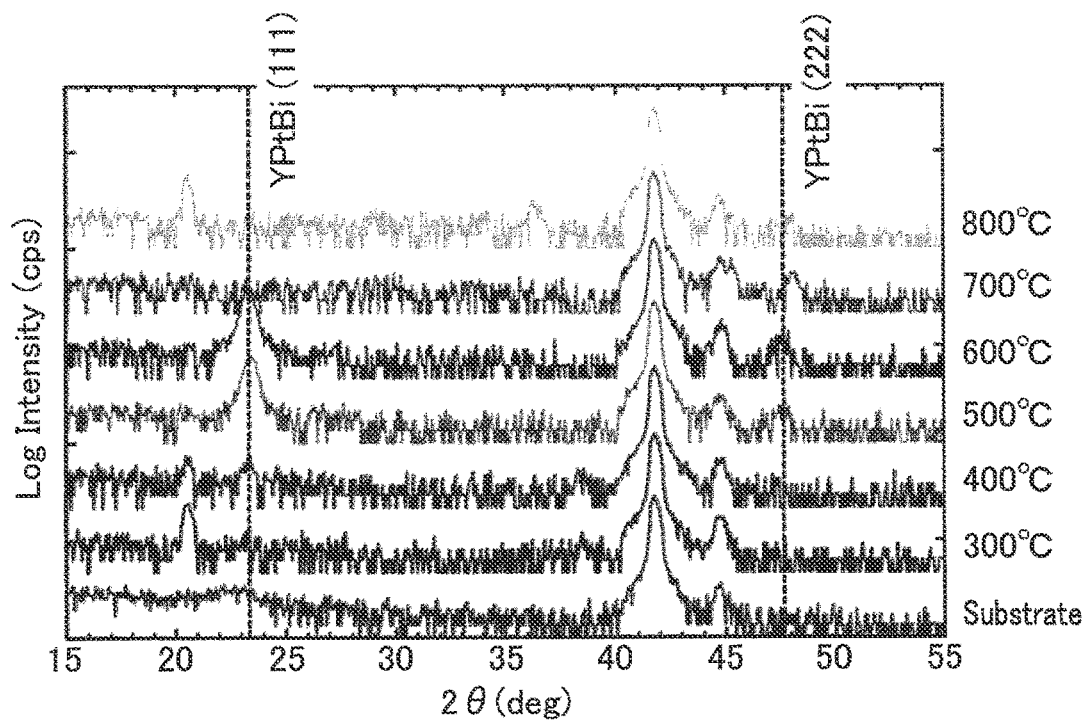
FIG. 3 is a diagram showing a growth temperature dependency of an X-ray diffraction spectrum of YPtBi according to a first embodiment.
Figure 4:
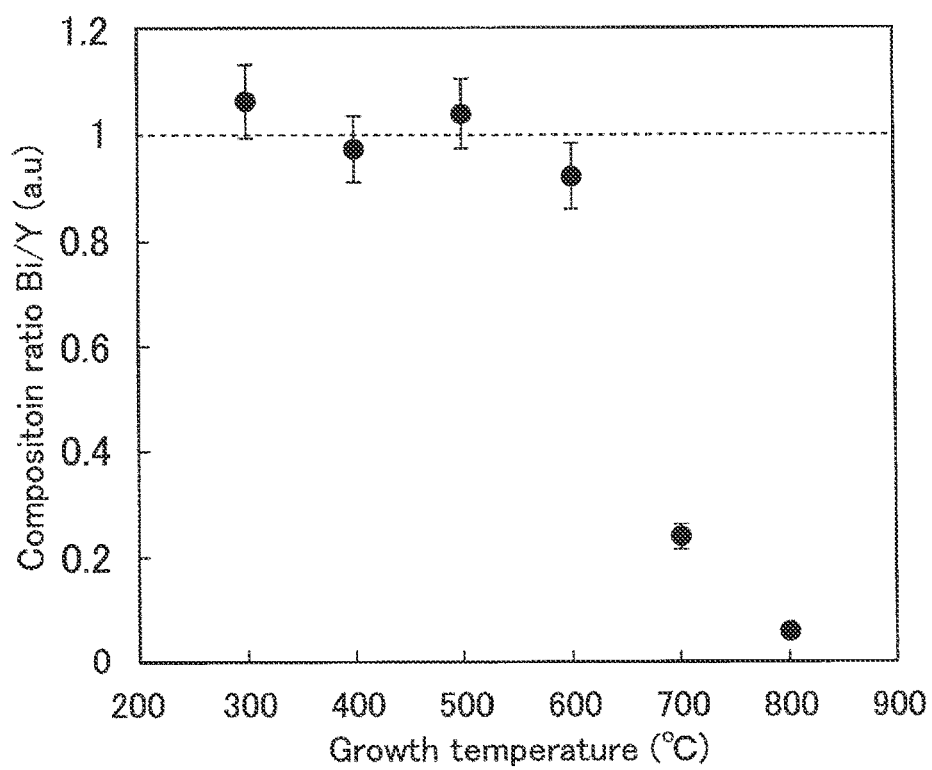
FIG. 4 is a diagram showing a result of a composition ratio analysis of YPtBi by a fluorescent X-ray analysis according to the first embodiment.

A heat resistance of YPtBi will be explained with reference to FIGS. 3 and 4. FIG. 3 is a diagram showing a growth temperature dependency of an X-ray diffraction spectrum of YPtBi. FIG. 4 is a diagram showing a result of a composition ratio analysis of YPtBi by fluorescent X-ray analysis.

FIG. 3 and FIG. 4 respectively show results of evaluations of the crystal structure and the composition ratio of YPtBi using a sample on which YPtBi is deposited to about 50 nm on a substrate by co-sputtering, while changing the substrate temperature. The substrate temperature is changed in a range of 300 to 800° C. C-sapphire was used as the substrate. The co-sputtering was performed using an YPt target and a bismuth (Bi) target.

A crystal structure of YPtBi will be explained with reference to FIG. 3.

As shown in FIG. 3, focusing on a peak on the (111) plane of YPtBi, the peak arising from the (111) plane of YPtBi was confirmed in a substrate temperature range of 300 to 600° C.

A composition ratio of YPtBi will be explained with reference to FIG. 4. In FIG. 4, the vertical axis represents a composition ratio of Bi to yttrium (Y). The horizontal axis represents a substrate temperature (growth temperature) when an YPtBi film is formed.

As shown in FIG. 4, at a substrate temperature of 600° C. or lower, the composition ratio of Bi/Y is stable around 1, which is an ideal value of the ratio in the crystal structure of a half Heusler alloy. This is consistent with the temperature range in which the peak arising from the (111) plane of YPtBi was obtained in the X-ray diffraction spectrum, as shown in FIG. 3.

Based on these results, it is understood that YPtBi can maintain the half Heusler structure even if heated to 400° C. or higher. Therefore, the HHA-TSM can have a heat resistance to temperatures of 400° C. or higher. Furthermore, since an YPtBi film can be formed in a wider temperature range by sputtering, the HHA-TSM can have a high affinity for semiconductor device mass production processes.

1.1.2 Electric Conductivity

An electric conductivity of YPtBi will be explained below. The electric conductivity was measured by a four-terminal method using a sample obtained by depositing YPtBi to about 11 nm on a c-sapphire substrate or a $SiO_2$/Si substrate. The substrate temperature when YPtBi is deposited by co-sputtering is 600° C. As a result of measurement by the four-terminal method, the electric conductivity of YPtBi on the c-sapphire substrate was, for example, $1.17 \times 10^5$ S/m. The electric conductivity of YPtBi on the $SiO_2$/Si substrate was, for example, $1.57 \times 10^5$ S/m. Thus, YPtBi has a high electric conductivity exceeding $10^5$ S/m.

1.1.3 Spin Hall Angle

Next, a spin Hall angle of YPtBi will be explained.

1.1.3.1 Sample Structure and Evaluation Method

Figure 5:
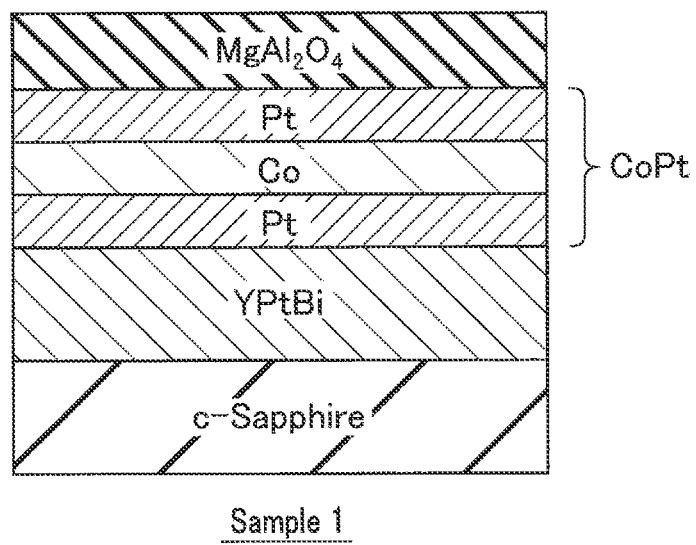
FIG. 5 is a schematic view showing a structure of sample 1 used in a spin Hall angle evaluation according to the first embodiment.
Figure 6:
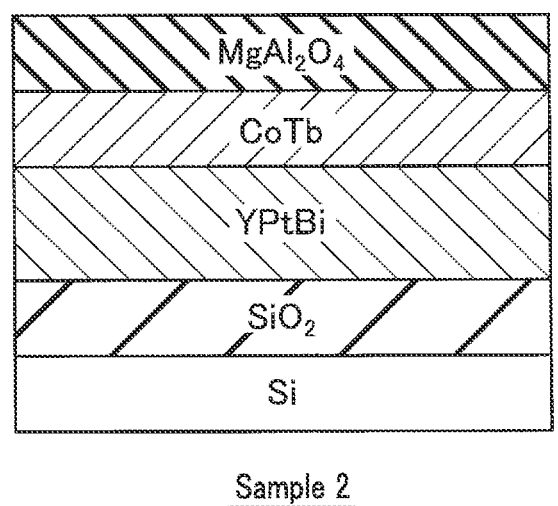
FIG. 6 is a schematic view showing a structure of sample 2 used in a spin Hall angle evaluation according to the first embodiment.
Figure 7:
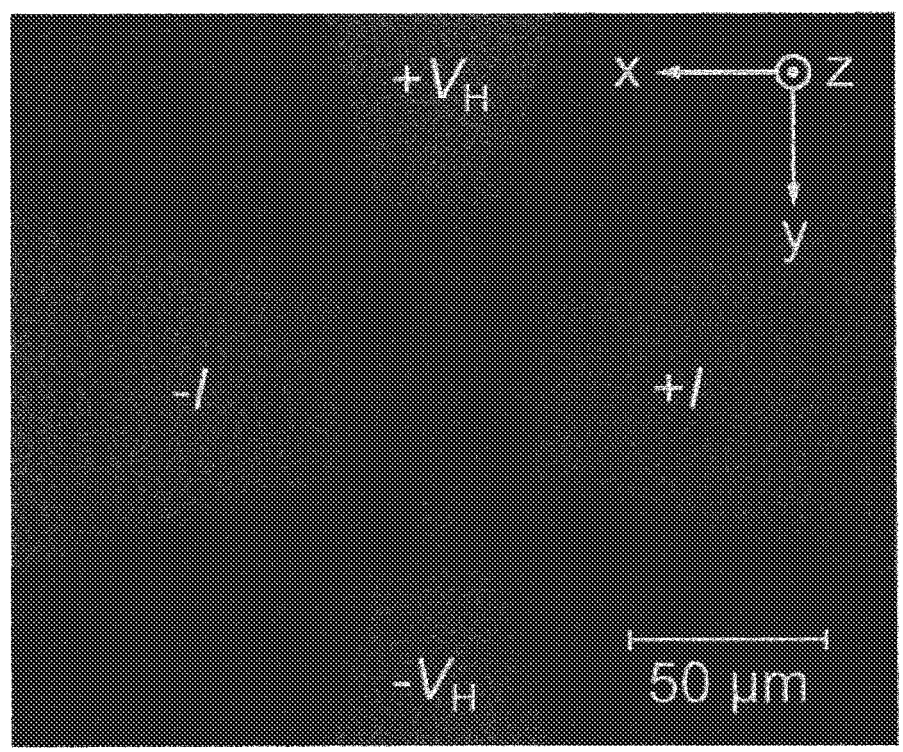
FIG. 7 is a diagram showing an outline of a measurement circuit used in a spin Hall angle evaluation, and a coordinate system of the measurement according to the first embodiment.

A sample structure for measuring a spin Hall angle and a measurement circuit will be explained with reference to FIGS. 5 to 7. In this embodiment, two kinds of samples were used. FIG. 5 is a cross-sectional view of sample 1. FIG. 6 is a cross-sectional view of sample 2. FIG. 7 is a diagram showing an outline of a measurement circuit and a coordinate system of the measurement.

The structures of sample 1 and sample 2 used for measuring the spin Hall angle will be explained first. Sample 1 and sample 2 each have a hetero junction between YPtBi and a ferromagnet.

As shown in FIG. 5, sample 1 includes a c-sapphire substrate, YPtBi, Pt, Co, and $MgAl_2O_4$. An YPtBi layer of a thickness of, for example, about 10 nm is formed on the c-sapphire substrate. On the YPtBi layer, for example, a Pt layer of a thickness of about 0.5 nm, a Co layer of a thickness of about 0.5 nm, and a Pt layer of a thickness of about 0.5 nm are alternately stacked. A Pt/Co/Pt layer stack functions as a ferromagnet CoPt. CoPt has a perpendicular magnetic anisotropy. On top of the upper most Pt layer, for example, a $MgAl_2O_4$ layer of a thickness of about 2 nm is formed. The $MgAl_2O_4$ layer functions as a cap layer for preventing oxidation.

As shown in FIG. 6, sample 2 includes a Si substrate, $SiO_2$, YPtBi, CoTb, and $MgAl_2O_4$. A $SiO_2$ layer is formed on the Si substrate. The $SiO_2$ layer may have any thickness. An YPtBi layer of a thickness of, for example, about 10 nm is formed on the $SiO_2$ layer. A CoTb layer of a thickness of, for example, about 3 nm is formed on the YPtBi layer. The CoTb layer has a ferromagnetic property. The CoTb layer has in-plane magnetic anisotropy. On top of the CoTb layer, for example, a $MgAl_2O_4$ layer of a thickness of about 2 nm is formed.

Uses of sample 1 and sample 2 will be explained. Generally, a hetero junction between a spin Hall layer and a ferromagnet layer is used to measure a spin Hall angle. In this case, spin dissipation occurs on an interface between the layers. The degree of the spin dissipation strongly depends on the kind of ferromagnetic material. CoPt used in sample 1 is a material in which the degree of spin dissipation is relatively small. Therefore, in the case of using sample 1, the spin Hall angle can be evaluated without spin dissipation correction. The structure of sample 1 is advantageous in that uncertain factors, such as the spin dissipation correction, are less. On the other hand, in the case of comparing spin Hall materials in terms of spin Hall angle, it is preferable to use the same ferromagnetic material. Therefore, CoTb was used as the ferromagnetic material of sample 2, owing to the high availability of information on actual results of utilizing CoTb to evaluate spin Hall angles of various spin Hall materials.

Next, a method for evaluating a spin Hall angle will be explained. To evaluate a spin Hall angle, a second-order harmonic method was utilized. The second-order harmonic method is a method for evaluating a spin Hall angle based on an external magnetic field dependency of a second-order harmonic Hall resistance $R^H_{2\omega}$ that is generated when an alternating current is applied to the sample. For example, in the measurement circuit shown in FIG. 7, an alternating current is caused to flow between a terminal −I and a terminal +I. Then, the measurement circuit measures a second-order harmonic component of a Hall voltage due to an anomalous Hall effect which occurs between a terminal $+V_H$ and a terminal $-V_H$. At this time, an external magnetic field $H_{ext}$ is applied in parallel with the current.

The evaluation is performed in the following sequence. First, to calculate a spin Hall angle, an anti-damping-like magnetic field $H_{DL}$ is extracted from the second-order harmonic Hall resistance $R^H_{2\omega}$ through fitting based on Equation 1

(Equation 1)

$$R^H_{2\omega} = \frac{R_{AHE}}{2} \frac{H_{DL}}{H_{ext} - H^{eff}_K} + R_{PHE} \frac{H_{FL+OF}}{H_{ext}} + C^{out}_{ONE} H_{ext} + R^{out}_{ANE+SSE} \quad (1)$$

Here, $R_{AHE}$ is an anomalous Hall resistance, $H_K^{eff}$ is an effective perpendicular anisotropy magnetic field, $R_{PHE}$ is a planar Hall resistance, $H_{FL+OF}$ is a sum of a field-like magnetic field and an Oersted magnetic field, $C^{out}_{ONE}$ is a normal Nernst effect that occurs due to a perpendicular temperature gradient, and $R^{out}_{ANE+SSE}$ is an anomalous Nernst effect and a spin Seebeck effect that occur due to a perpendicular temperature gradient. In Equation 1, in the case of a perpendicular magnetic anisotropy, $H_K^{eff}$ is greater than 0. In the case of an in-plane magnetic anisotropy, $H_K^{eff}$ is smaller than 0. In Equation 1, $H_{DL}$, $H_{FL+OF}$, $H_K^{eff}$, $C^{out}_{ONE}$, and $R^{out}_{ANE+SSE}$ are fitting parameters.

Next, using Equation 2, the extracted $H_{DL}$ is converted to a spin Hall angle.

(Equation 2)

$$\theta_{SH} = \frac{4\pi e M_s t_{FM}}{h} \frac{H_{DL}}{J_{NM}} \quad (2)$$

Here, e is an elementary charge, $M_S$ is a saturation magnetization, $t_F$m is a thickness of a ferromagnet, h is a Planck constant, and $J_{NM}$ is a current density of the YPtBi layer. Thus, the spin Hall angle $\theta_{SH}$ is calculated.

Figure 8:
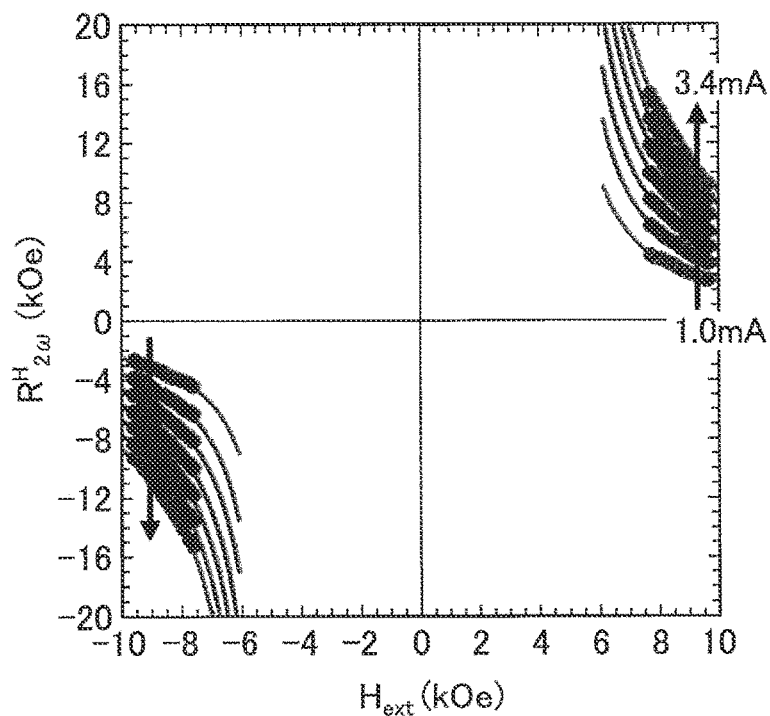
FIG. 8 is a diagram showing an external magnetic field dependency of a second-order harmonic component of a Hall resistance in sample 1 according to the first embodiment.
Figure 9:
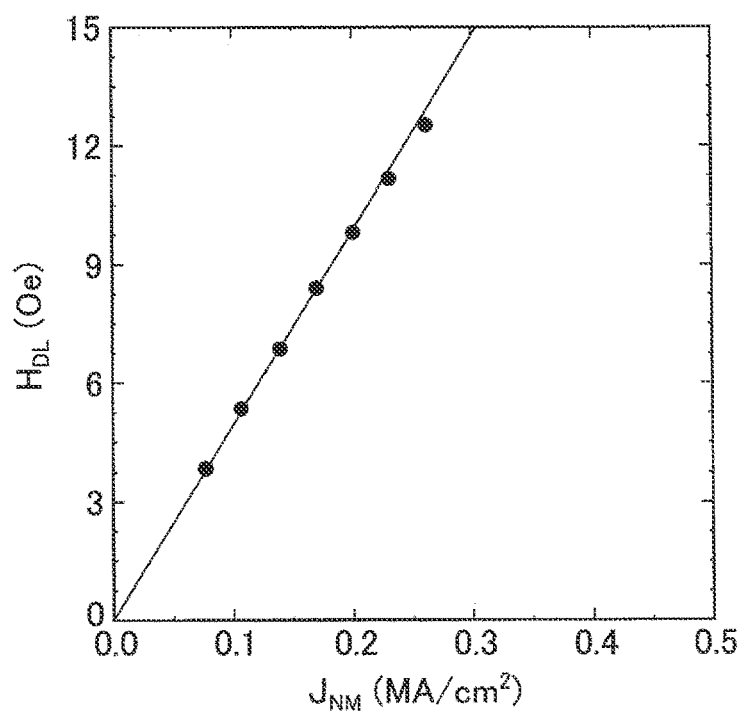
FIG. 9 is a diagram showing a relationship between an anti-damping-like magnetic field and a current density in an YPtBi layer in sample 1 according to the first embodiment.

1.1.3.2 Specific Example of Results of Measurement of External Magnetic Field Dependency and Spin Hall Angle Next, a specific example of results of measurement of an external magnetic field dependency of a second-order harmonic Hall resistance $R^H_{2\omega}$, and a spin Hall angle $\theta_{SH}$ will be explained with reference to FIGS. 8 and 9. FIG. 8 is a diagram showing an external magnetic field dependency of a second-order harmonic component of a Hall resistance in sample 1. Plots in FIG. 8 respectively indicate measurement values, and solid lines indicate fitting results in accordance with Equation 1. An amplitude of the applied alternating current ranges from 1.0 to 3.4 mA. FIG. 8 shows an example in which the alternating current is changed by 0.4 mA each time. The frequency of the alternating current is 259.68 Hz. FIG. 9 is a diagram showing the relationship between an anti-damping-like magnetic field and a current density in an YPtBi layer in sample 1.

As shown in FIG. 9, the anti-damping-like magnetic field $H_{DL}$ increases in proportion to the current density $J_{NM}$ of YPtBi. The ratio $H_{DL}/J_{NM}$ and the saturation magnetization $M_S$=632 emu/cm$^3$ obtained by, for example, a superconducting quantum interference device are substituted into Equation 2. As a result, the value of the spin Hall angle $\theta_{SH}$ is calculated to be about 1.3. Thus, it was verified that YPtBi has the spin Hall angle $\theta_{SH}$ exceeding 1.

A spin Hall angle was also measured for sample 2 using CoTb with the second-order harmonic method. As a result, for example, the ratio $H_{DL}/J_{NM}$=5.98 Oe·cm$^2$/MA and the saturation magnetization $M_S$=456 emu/cm$^3$ were obtained, and 0.25 was obtained as the spin Hall angle $\theta_{SH}$ of YPtBi. Generally, it is known that the spin Hall angle $\theta_{SH}$ in the case of measurement using CoTb is estimated at about one-fifth to one-tenth of the spin Hall angle $\theta_{SH}$ in the case of measurement using another ferromagnet due to the spin dissipation effect of CoTb. YPtBi indicates a similar tendency.

1.1.3.3 Comparison with Other Spin Hall Materials in Terms of Spin Hall Angle Results of comparison between the spin Hall angle $\theta_{SH}$ of YPtBi and that of other spin Hall materials will be explained with reference to FIG. 10. FIG. 10 is a table showing a spin Hall angle ($\theta_{SH}$(CoTb)) measured by using CoTb and a spin Hall angle (Intrinsic $\theta_{SH}$) in which spin dissipation effect of CoTb has been corrected, with regard to various spin Hall materials including YPtBi. In the example shown in FIG. 10, $\theta_{SH}$(CoTb) of YPtBi indicates a measurement result of sample 2, and Intrinsic $\theta_{SH}$ indicates a measurement result of sample 1. As the spin Hall materials compared with YPtBi, FIG. 10 shows Ta and Pt which are heavy metals, and $Bi_2Se_3$, (Bi, Sb)$_2$Te$_3$, and BiSb which are topological insulators.

As shown in FIG. 10, focusing on the spin Hall angle $\theta_{SH}$(CoTb), the spin Hall angle $\theta_{SH}$(CoTb) of YPtBi is 0.25. The spin Hall angle $\theta_{SH}$(CoTb) of YPtBi is greater by about an order of magnitude or more as compared to the spin Hall angle $\theta_{SH}$(CoTb) of Ta and Pt which are heavy metals. In comparison between the spin Hall angle $\theta_{SH}$(CoTb) of YPtBi and those of $Bi_2Se_3$, (Bi, Sb)$_2$Te$_3$, and BiSb which are topological insulators, the spin Hall angle $\theta_{SH}$(COTb) of YPtBi is smaller by about an order of magnitude than that of BiSb, but is equivalent to those of $Bi_2Se_3$ and (Bi, Sb)$_2$Te$_3$.

Focusing on the spin Hall angle (Intrinsic $\theta_{SH}$), the spin Hall angle $\theta_{SH}$ (Intrinsic $\theta_{SH}$) of YPtBi is 1.4. Thus, the spin Hall angle $\theta_{SH}$(CoTb) of YPtBi is about one-fifth of the spin Hall angle (Intrinsic $\theta_{SH}$). On the other hand, the spin Hall angle $\theta_{SH}$(CoTb) of each of the heavy metals and topological insulators is about one-fifth to one-tenth of the spin Hall angle (Intrinsic $\theta_{SH}$). Thus, the measurement results of YPtBi indicate a tendency similar to those of the other spin Hall materials.

1.1.4 Magnetic Field Dependency of Hall Resistance

To confirm that YPtBi has a surface state of Dirac type, results of measuring a magnetic field dependency of a Hall resistance $R_H$ using a sample having an YPtBi film deposited on a substrate will be explained with reference to FIG. 11. FIG. 11 is a graph showing a relationship between a Hall resistance $R_H$ and an in-plane application angle $\varphi_K$ of a magnetic field. As a substrate of a sample of measurement of the Hall resistance $R_H$, c-sapphire was used. The substrate temperature when an YPtBi was deposited was 600° C. In the graph of FIG. 11, the vertical axis represents a Hall resistance $R_H$ obtained when an in-plane rotating magnetic field was applied to the sample mentioned above. The horizontal axis represents an in-plane application angle $\varphi_H$ of the magnetic field. The in-plane application angle $\varphi_H$ of the magnetic field is an angle with reference to a parallel to the direction of the applied direct current. The measurement temperature is 4 K, and the magnitude of the magnetic field is 7.6 kOe. Plots in the graph indicate measurement values, and the solid line indicates a fitting curve.

As shown in FIG. 11, the measurement values of the Hall resistance $R_H$ can be satisfactorily explained by the fitting curve (solid line) including one-fold symmetry components of cos $\varphi_H$ and sin $\varphi_H$, and a two-fold symmetry component of sin $2\varphi_H$. The one-fold symmetry component of the Hall resistance $R_H$ originates from the normal Hall effect that occurs due to deviation of the applied angle of the magnetic field from the film plane. On the other hand, the two-fold symmetry component is a magnetoresistance effect called a planar Hall effect, and arises from a topological surface state of Dirac type in YPtBi which is a nonmagnet. In other words, the presence of the planar Hall effect means that YPtBi which is a nonmagnet has a surface state of Dirac type. Therefore, the great spin Hall angle in YPtBi arises from a strong anti-damping torque due to the surface state of Dirac type.

1.1.5 Power Consumption in Magnetization Inversion of Magnet

Power consumption in magnetization inversion of a magnet provided on a spin Hall material will be explained with reference to FIG. 12. FIG. 12 is a table showing an absolute value of the spin Hall angle $\theta_{SH}$, an electric conductivity, and a normalized power consumption of each spin Hall material. FIG. 12 shows cases in which a heavy metal or an HHA-TSM is used as a kind of spin Hall material. More specifically, in the cases shown in FIG. 12, Ta, Pt, or W having a thickness of 6 nm is used as a heavy metal, and YPtBi having a thickness of 10 nm is used as an HHA-TSM. The normalized power consumption is represented as a value of power consumption in magnetization reversal of CoFeB (magnet) having a thickness of 1.5 nm normalized based on a power consumption in the case of using Ta of 1.

As shown in FIG. 12, the absolute value of the spin Hall angle $\theta_{SH}$ of YPtBi, which is an HHA-TSM, is greater than those of Ta, Pt, and W, which are heavy metals. In all of Ta, Pt, W, and YPtBi, a high electric conductivity of $1.0 \times 10^5$ S/m or higher is obtained. The normalized power consumptions of Pt and W relative to Ta are respectively $3.6 \times 10^{-1}$ and $1.6 \times 10^{-1}$. On the other hand, the normalized power consumption of YPtBi relative to Ta is $3.3 \times 10^{-2}$. In other words, when YPtBi is used as the spin Hall material, the power consumption is 3.3% of that in the case of using Ta. Further, the power consumption in the case of using YPtBi is about one-fifth of that in the case of using W where the power consumption is the lowest of those of the heavy metals.

As described above, the present inventors have discovered that the HHA-TSM including YPtBi can reverse the magnetization of a magnet with a lower power consumption as compared to heavy metals.

1.1.6 Comparison with Topological Insulator

Results of comparison between topological insulators and HHA-TSMs will be explained with reference to FIG. 13. FIG. 13 is a table showing a heat resistance, toxic material, an SHE, an electric conductivity, and surface roughness of topological insulators and HHA-TSMs. Here, toxic material indicates whether a toxic material is contained as a component of the material.

As shown in FIG. 13, the heat resistance of the topological insulators is 300° C. or lower, whereas the heat resistance of the HHA-TSM is about 600° C. In back-end process of the semiconductor manufacture, the material is required to be heat-resistant to a temperature of 400° C. or higher. Therefore, the HHA-TSMs have a higher affinity for the semiconductor manufacturing process as compared to the topological insulators.

For example, the materials, such as Sb, Se, or Te which can be included in the topological insulator, have toxity. On the other hand, the HHA-TSMs can be formed of a nontoxic material, such as YPtBi.

In both the topological insulators and the HHA-TSMs, the SHE is stronger, namely, a spin Hall angle is larger, as compared to the heavy metals. The electric conductivities of the topological insulators, except for BiSb, tend to be relatively low. In contrast, the electric conductivities of HHA-TSMs are relatively high.

The surface roughness of the HHA-TSMs is smaller than in the topological insulators. Therefore, the surface roughness of the magnet in contact with the HHA-TSMs is also small. Accordingly, the perpendicular magnetic anisotropy of the magnet can be improved.

As described above, the present inventors have discovered that the HHA-TSMs including YPtBi are materials having a heat resistance to a temperature higher than 400° C., not containing a toxic material, and having a relatively small surface roughness. In other words, the present inventors have discovered that as the spin Hall materials, the HHA-TSMs have a higher affinity for the semiconductor manufacturing process as compared to the topological insulators.

1.2 Configuration of Magnetic Memory

Next, two examples of a magnetic memory in which an HHA-TSM is used as the spin injection source will be explained. In the explanations below, one of the source and drain of a transistor is referred to as "one end of the transistor", and the other of the source and drain of the transistor is referred to as "the other end of the transistor".

1.2.1 First Example

A first example will be explained. As the first example, an example of a cell structure of an SOT magnetic memory of three-terminal type will be explained with reference to FIG. 14. FIG. 14 is a schematic view showing an example of a cell structure of a SOT magnetic memory of three-terminal type.

As illustrated in FIG. 14, a SOT magnetic memory 100 includes a magnetic memory element 101, a spin injection source 102, a write transistor 103, and a read transistor 104. The magnetic memory element 101 is a memory element having a magnetoresistive effect provided by a magnetic tunnel junction (MTJ) (hereinafter also referred to as the "MTJ element").

The MTJ element 101 includes a ferromagnet 111, an insulator 112, and a ferromagnet 113. For example, the ferromagnet 113, the insulator 112, and the ferromagnet 111 are stacked in this order on the spin injection source 102.

The ferromagnet 111 has ferromagnetic properties, and has an axis of easy magnetization in a direction perpendicular to a film surface. The magnetization direction of the ferromagnet 111 is fixed. In other words, the ferromagnet 111 functions as a magnetization fixed layer. The magnetization direction of the ferromagnet 111 is not changed by the spin current injected from the spin injection source 102.

The insulator 112 is in contact with and interposed between the ferromagnets 111 and 113. The insulator 112 is a non-magnetic insulator. The insulator 112 functions as a tunnel barrier layer. MgO is suitable as the material of the insulator 112. Another material, such as AlO, may be used as the insulator 112. Alternatively, a metal oxide containing at least one of gallium (Ga), aluminum (Al), magnesium (Mg), hafnium (Hf), and zirconium (Zr) may be used as the insulator 112.

The ferromagnet 113 has ferromagnetic properties, and has an axis of easy magnetization in a direction perpendicular to a film surface. The magnetization direction of the ferromagnet 113 is controlled by the spin current injected from the spin injection source 102. In other words, the ferromagnet 113 functions as a magnetization free layer.

If the magnetization direction of the ferromagnet 111 and the magnetization direction of the ferromagnet 113 are parallel, the MTJ element 101 is in a low resistance state. On the other hand, if the magnetization direction of the ferromagnet 111 and the magnetization direction of the ferromagnet 113 are antiparallel, the MTJ element 101 is in a high resistance state. Data is allocated in accordance with the resistance state of the MTJ element 101.

The ferromagnet 111 and the ferromagnet 113 contain at least one of cobalt (Co), iron (Fe), nickel (Ni), manganese (Mn), boron (B), silicon (Si), zirconium (Zr), niobium (Nb), tantalum (Ta), ruthenium (Ru), iridium (Ir), platinum (Pt), gallium (Ga), aluminum (Al), palladium (Pd), terbium (Tb), and gadolinium (Gd). Each of the ferromagnets 111 and 113 may be a layer stack including multiple layers. The ferromagnet 111 and the ferromagnet 113 may have the same configuration or different configurations.

The spin injection source 102 contains an HHA-TSM. As the HHA-TSM, for example, YPtBi is used. The write transistor 103 is coupled to one end of the HHA-TSM in a direction parallel to the film surface of the HHA-TSM. The other end of the HHA-TSM opposite to the one end of the HHA-TSM is grounded (coupled to a ground voltage wiring).

One end of the write transistor 103 is coupled to the spin injection source 102 (HHA-TSM), and the other end thereof is coupled to, for example, a power supply (not shown). A control signal is input to the gate of the write transistor 103.

One end of the read transistor 104 is coupled to the ferromagnet 111 of the MTJ element 101, and the other end thereof is coupled to a read circuit (not shown). A control signal is input to the gate of the read transistor 104.

In the memory 100, for example, in the case of writing data in the MTJ element 101, the write transistor 103 is set to an ON state and the read transistor 104 is set to an OFF state. A current flows from the power supply to the ground via the write transistor 103 in the ON state and the spin injection source 102. At this time, a pulse current flows in a direction parallel to a plane of the HHA-TSM (the spin injection source 102) in contact with the ferromagnet 113 (hereinafter referred to as the "in-plane current"). In response to a flow of the pulsed in-plane current through the HHA-TSM, a spin current in a direction perpendicular to the plane is generated. Then, the spin current is injected from the HHA-TSM into the ferromagnet 113 (magnetization free layer). An anti-damping torque generated by the spin current and a torque generated by an external magnetic field (in-plane bias magnetic field) applied in parallel to the in-plane current causes magnetization reversal of the ferromagnet 113. In other words, the magnetization direction is controlled and data is written in the MTJ element 101.

For example, in the case of reading data of the MTJ element 101, the write transistor 103 is set to an OFF state and the read transistor 104 is set to an ON state. Then, a read current flows from the power supply to the MTJ element 101 via the read transistor 104 in the ON state. At this time, the data in the MTJ element 101 is read based on a resistance value of the MTJ element 101.

1.2.2 Second Example

A second example will be explained. As the second example, an example of a cell structure of an SOT magnetic memory of two-terminal type will be explained with reference to FIG. 15. FIG. 15 is a schematic diagram showing an example of a cell structure of an SOT magnetic memory of two-terminal type.

As illustrated in FIG. 15, a SOT magnetic memory 200 includes a MTJ element 201, a spin injection source 202, and a write/read transistor 203. The second example differs from the first example in that no transistor is coupled to the MTJ element 201 and the ferromagnet 211 is grounded.

The configuration of the MTJ element 201 is similar to that of the MTJ element 101 of the first example. More specifically, the MTJ element 201 includes a ferromagnet 211, an insulator 212, and a ferromagnet 213. The ferromagnet 211, similarly to the ferromagnet 111, functions as a magnetization fixed layer. The insulator 212, similarly to the insulator 112, functions as a tunnel barrier layer. The ferromagnet 213, similarly to the ferromagnet 113, functions as a magnetization free layer.

The spin injection source 202 contains an HHA-TSM. As the HHA-TSM, for example, YPtBi is used.

One end of the write/read transistor 203 is coupled to one end of the HHA-TSM (the spin injection source 202), and the other end of the write/read transistor 203 is coupled to, for example, a power supply (not shown). A control signal is input to the gate of the write/read transistor 203.

For example, in the case of writing data in the MTJ element 201, the write/read transistor 203 is set to an ON state. Then, a current flows from the power supply to the ground via the write/read transistor 203, the spin injection source 202, the ferromagnet 213, the insulator 212, and the ferromagnet 211. At this time, a pulsed in-plane current flowing in the HHA-TSM (the spin injection source 202) causes a spin current to be injected from the spin injection source 202 to the ferromagnet 213 (magnetization free layer). An anti-damping torque generated by the spin current causes magnetization reversal of the ferromagnet 213, thereby writing data. At this time, a spin polarized current generated from the ferromagnet 211 can also assist the magnetization inversion of the ferromagnet 213. Due to the magnetization inversion assistance by the spin polarization current generated from the ferromagnet 211, the magnetization reversal can be performed without an external magnetic field (in-plane bias magnetic field), regardless of the relationship in direction between an axis of easy magnetization of the ferromagnet 213 and a spin quantization axis of the spin current generated from the spin injection source 202.

1.3 Advantages of Embodiment

The present inventors discovered that an HHA-TSM has a great spin Hall angle exceeding 1 arising from the surface state of Dirac type and a high electric conductivity exceeding $10^5$ S/m, and consumes less power to reverse magnetization of a magnet as compared to heavy metals-. The present inventors also discovered that an HHA-TSM has a high resistance to a temperature higher than 400° C. In other words, the present inventors discovered that an HHA-TSM has excellent properties as a spin Hall material, and a high affinity for a semiconductor manufacturing process. By using an HHA-TSM as the spin injection source, the power consumption for magnetization reversal of a ferromagnet can be reduced. Furthermore, by applying an HHA-TSM to the spin injection source of an SOT magnetic memory, the current and the power for writing in the SOT magnetic memory can be reduced.

2. Second Embodiment

A second embodiment will now be explained. A magnetic memory of domain wall motion type, which is different from the first embodiment, will be explained as the second embodiment. Hereinafter, differences from the first embodiment will be mainly explained.

2.1 Configuration of Magnetic Memory

Figure 16:
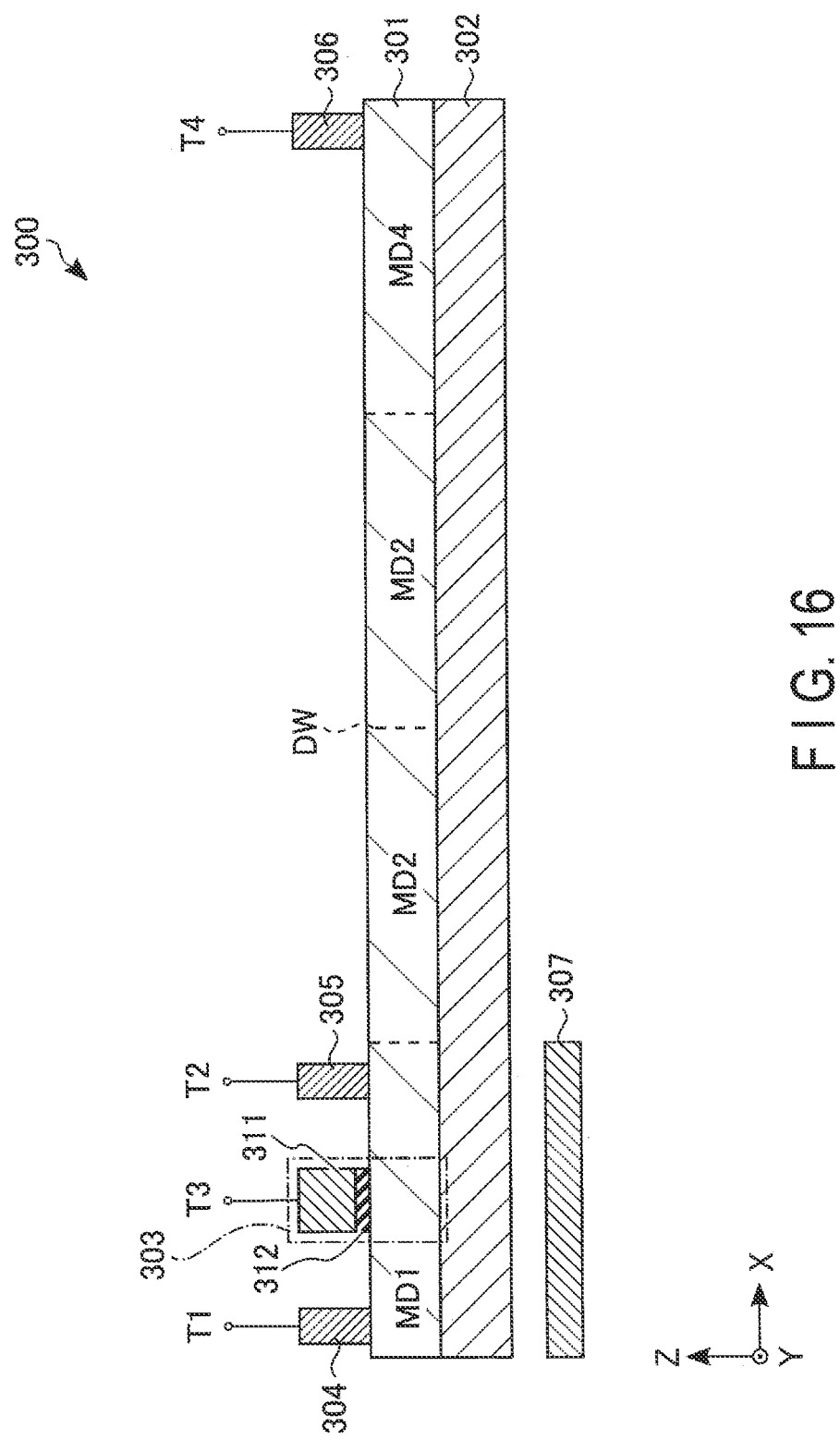
FIG. 16 is a schematic diagram showing an example of a cell structure of a magnetic memory according to a second embodiment.

A configuration of a magnetic memory will be explained with reference to FIG. 16. FIG. 16 is a schematic view showing an example of a cell structure of a magnetic memory.

As illustrated in FIG. 16, a magnetic memory 300 includes a ferromagnet 301, a spin injection source 302, a read portion 303, conductors 304 to 306, a ferromagnet 307, and terminals T1 to T4. In the explanation below, a direction parallel to a film surface of the ferromagnet 301 and directed from the conductor 304 to the conductor 306 is defined as an X direction. A direction parallel to the film surface of the ferromagnet 301 and intersecting the X direction is defined as a Y direction. A direction perpendicular to the film surface of the ferromagnet 301 is defined as a Z direction.

The ferromagnet 301 is provided on the spin injection source 302. The ferromagnet 301 has ferromagnetic properties, and has an axis of easy magnetization in the Z direction perpendicular to the film surface. The ferromagnet 301 functions as a magnetization free layer. The ferromagnet 301 includes a plurality of magnetic domains MD divided by domain walls DW. One magnetic domain MD functions as one storage element. In the example illustrated in FIG. 16, the ferromagnet 301 includes four magnetic domains MD1 to MD4. The magnetic domains MD1 to MD4 are arranged in a line in the X direction. The ferromagnet 301 contains at least one of Co, Fe, Ni, Mn, B, Si, Zr, Nb, Ta, Ru, Ir, Pt, Ga, Al, Pd, Tb, and Gd. The ferromagnet 301 may be a layer stack including multiple layers.

The spin injection source 302 contains an HHA-TSM. As the HHA-TSM, for example, YPtBi is used.

The read portion 303 reads a magnetization direction in a magnetic domain MD (the magnetic domain MD1 in the example illustrated in FIG. 16). The read portion 303 includes a ferromagnet 311 and an insulator 312.

The ferromagnet 311 has ferromagnetic properties, and has an axis of easy magnetization in the Z direction perpendicular to the film surface. The magnetization direction of the ferromagnet 311 is fixed. In other words, the ferromagnet 311 functions as a magnetization fixed layer. The magnetization direction of the ferromagnet 311 is not changed by the spin current injected from the spin injection source 302. The ferromagnet 311 contains at least one of Co, Fe, Ni, Mn, B, Si, Zr, Nb, Ta, Ru, Ir, Pt, Ga, Al, Pd, Tb, and Gd. The ferromagnet 311 may be a layer stack including multiple layers.

The insulator 312 is in contact with one magnetic domain MD of the ferromagnet 301 (the magnetic domain MD1 in the example illustrated in FIG. 16) and the ferromagnet 311, and interposed between the ferromagnets 301 and 311. The insulator 312 is a non-magnetic insulator. The insulator 312 functions as a tunnel barrier layer. MgO is suitable as the material of the insulator 112. Another material, such as AlO, may be used as the insulator 312. Alternatively, a metal oxide containing at least one of Ga, Al, Mg, Hf, and Zr may be used as the insulator 312.

An MTJ element is constituted by the ferromagnet 311, the insulator 312, and one magnetic domain MD of the ferromagnet 301 to which the insulator 312 is in contact. In other words, the read portion 303 includes the MTJ element.

The conductors 304 to 306 are provided on the ferromagnet 301 along the X direction. The conductors 304 to 306 may be provided on the spin injection source 302, or may be in contact with both the ferromagnet 301 and the spin injection source 302. The conductor 304 is provided on the ferromagnet 301 near an end of the ferromagnet 301 in the X direction. The conductor 305 is spaced apart from the conductor 304 in the X direction with the read portion 303 interposed therebetween. In the ferromagnet 301, one magnetic domain MD is formed in a region including contact surfaces between the ferromagnet 301 and the conductors 304 and 305. The conductor 306 is provided near another end of the ferromagnet 301 opposite to the end which the conductor 304 is in contact with in the X direction. The conductors 304 to 306 contain a conductive material. The conductor 305 may be omitted.

The ferromagnet 307 is spaced apart from the spin injection source 302 in the Z direction with an insulator (not shown) interposed therebetween. The conductor 304 and the conductor 305 are arranged above the ferromagnet 307 in the Z direction via the spin injection source 302 and the ferromagnet 301. The ferromagnet 307 has ferromagnetic properties, and has an axis of easy magnetization in the X direction parallel to the film surface. The magnetization direction of the ferromagnet 307 is fixed. The ferromagnet 307 applies a bias magnetic field to the ferromagnet 301 and the spin injection source 302. The bias magnetic field is utilized to invert the magnetization direction of the ferromagnet 301 in a write operation. The ferromagnet 307 contains at least one of Co, Fe, Ni, Mn, B, Si, Zr, Nb, Ta, Ru, Ir, Pt, Ga, Al, Pd, Tb, and Gd. The ferromagnet 307 may be a layer stack including multiple layers.

The terminal T is coupled to the conductor 304. The terminal T2 is coupled to the conductor 305. The terminal T3 is coupled to the read portion 303 (the ferromagnet 311). The terminal T4 is coupled to the conductor 306.

For example, in the case of writing data in the magnetic domain MD1, a write current flows between the terminal T1 and the terminal T2. The write current flows through the ferromagnet 301 (the magnetization free layer) and the HHA-TSM (the spin injection source 302). A pulsed in-plane current flows through the HHA-TSM, and a spin current is injected into the ferromagnet 301. An anti-damping torque generated by the spin current causes magnetization reversal of the magnetic domain MD1 of the ferromagnet 301, thereby writing data.

For example, in the case of reading data from the magnetic domain MD1, a read current flows between the terminal T3 and the terminal T1 or the terminal T2. Based on a resistance value of the MTJ element of the read portion 303, the magnetization direction (data) of the magnetic domain MD1 is read.

For example, in the case of moving the magnetic domain MD, a domain wall motion current flows between the terminal T1 and the terminal T4. In response to the current flowing through the HHA-TSM and the ferromagnet 301, the domain wall DW, in other words, the magnetic domain MD of the ferromagnet 301 is moved. By the motion of the domain wall, the magnetization direction of each magnetic domain MD in the ferromagnet 301 can be controlled. Based on the same principle as described above, the magnetization direction of each of the magnetic domains MD in the ferromagnet 301 can be read by the read portion 303.

2.2 Advantages of Embodiment

With the configuration of this embodiment, an HHA-TSM can be applied to a magnetic memory of domain wall motion type.

3. Third Embodiment

Next, a third embodiment will be explained. In the explanation of the third embodiment, four examples of applying an HHA-TSM to a spin injection source of a spin Hall oscillator will be explained. Hereinafter, differences from the first and second embodiments will be mainly explained.

3.1 First Example

Figure 17:
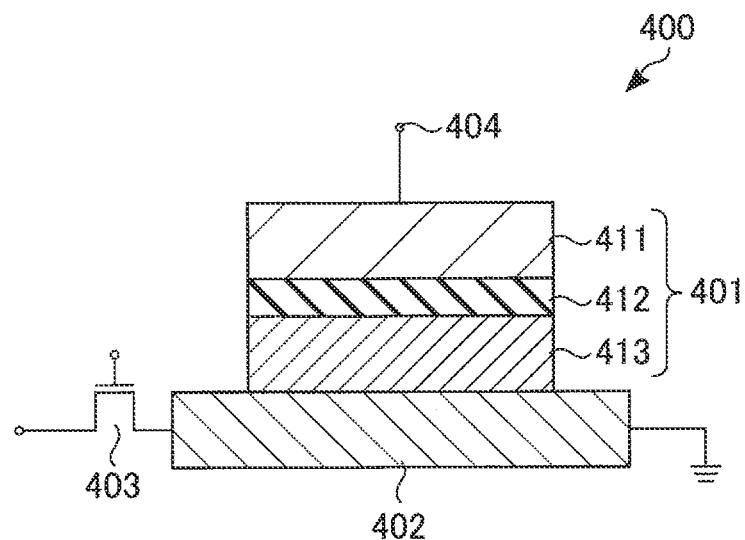
FIG. 17 is a schematic diagram showing an example of a spin Hall oscillator of three-terminal type according to a first example of a third embodiment.

A first example will be explained. In the explanation of the first example, a spin Hall oscillator of three-terminal type will be explained with reference to FIG. 17. FIG. 17 is a schematic diagram showing an example of a spin Hall oscillator of three-terminal type.

As illustrated in FIG. 17, a spin Hall oscillator 400 of three-terminal type includes an MTJ element 401, a spin injection source 402, a magnetization driving transistor 403, and an MTJ power supply terminal 404.

The MTJ element 401 includes a ferromagnet 411, an insulator 412, and a ferromagnet 413. For example, the ferromagnet 413, the insulator 412, and the ferromagnet 411 are stacked in this order on the spin injection source 402.

The ferromagnet 411 has ferromagnetic properties, and has an axis of hard magnetization similar to that of the ferromagnet 413. The magnetization direction of the ferromagnet 411 is fixed. In other words, the ferromagnet 411 functions as a magnetization fixed layer. The magnetization direction of the ferromagnet 411 is not changed by the spin current injected from the spin injection source 402.

The insulator 412 is in contact with and interposed between the ferromagnets 411 and 413. The insulator 412 is a non-magnetic insulator. The insulator 412 functions as a tunnel barrier layer. MgO is suitable as the material of the insulator 412. Another material, such as AlO, may be used as the insulator 412. Alternatively, a metal oxide containing at least one of Ga, Al, Mg, Hf, and Zr may be used as the insulator 412.

The ferromagnet 413 has ferromagnetic properties, and has an axis of hard magnetization or an axis of easy magnetization in a direction parallel to a spin quantization axis of the spin current injected from the spin injection source 402 to the ferromagnet 413. The ferromagnet 413 functions as a magnetization free layer. The magnetization of the ferromagnet 413 can precess due to the spin current injected from the spin injection source 402. Furthermore, a frequency or an amplitude of the precession can be changed by applying an external magnetic field (in-plane bias magnetic field) in parallel with the axis of hard magnetization or the axis of easy magnetization of the ferromagnet 413.

The ferromagnet 411 and the ferromagnet 413 contain at least one of Co, Fe, Ni, Mn, B, Si, Zr, Nb, Ta, Ru, Ir, Pt, Ga, Al, Pd, Tb, and Gd. Each of the ferromagnets 411 and 413 may be a layer stack including multiple layers. The ferromagnet 411 and the ferromagnet 413 may have the same configuration or different configurations.

The spin injection source 402 contains an HHA-TSM. As the HHA-TSM, for example, YPtBi is used.

One end of the magnetization driving transistor 403 is coupled to one end of the HHA-TSM (the spin injection source 402), and the other end of the magnetization driving transistor 403 is coupled to, for example, a power supply (not shown). A control signal is input to the gate of the magnetization driving transistor 403. The other end of the HHA-TSM opposite to the one end of the HHA-TSM (the spin injection source 402), to which the magnetization driving transistor 403 is coupled, is grounded.

The MTJ power supply terminal 404 is coupled to the ferromagnet 411 of the MTJ element 401. Due to the current supplied from the MTJ power supply terminal 404, the magnetization direction of the ferromagnet 413 can be electrically detected by a tunneling magnetoresistive (TMR) effect that occurs in the MTJ terminal 401.

In the case of operating the spin Hall oscillator 400 as an oscillator, the magnetization driving transistor 403 is set to an ON state. The in-plane current flows, through the magnetization driving transistor 403 in the ON state, from one end of the spin injection source 402 to the other end, which is grounded. Upon flow of the in-plane current through the HHA-TSM (the spin injection source 402), a spin current is injected to the ferromagnet 413. As a result, the magnetization of the ferromagnet 413 processes. The precession of the magnetization of the ferromagnet 413 is converted to an electric signal due to the TMR effect of the MTJ element 401. Then, the electric signal is output as an alternating voltage from the voltage output terminal 404 coupled to the ferromagnet 411.

3.2 Second Example

Figure 18:
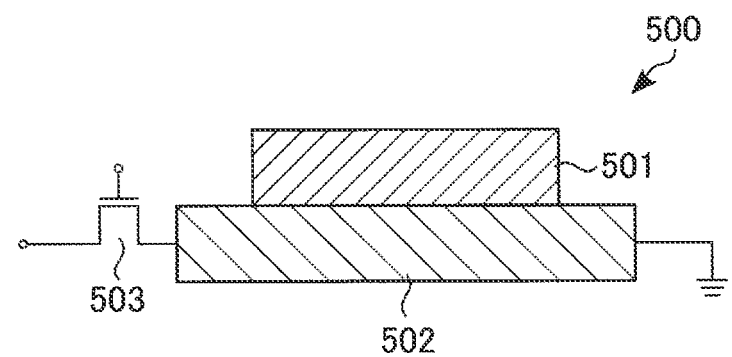
FIG. 18 is a schematic diagram showing an example of a spin Hall oscillator of two-terminal type according to a second example of the third embodiment.

A second example will be explained. In the explanation of the second example, a spin Hall oscillator of two-terminal type will be explained with reference to FIG. 18. FIG. 18 is a schematic diagram showing an example of a spin Hall oscillator of two-terminal type.

As illustrated in FIG. 18, a spin Hall oscillator 500 of two-terminal type includes a ferromagnet 501, a spin injection source 502, and a magnetization driving transistor 503.

The ferromagnet 501 is provided on the spin injection source 502. The ferromagnet 501 has ferromagnetic properties, and has an axis of hard magnetization direction parallel to a spin quantization axis of a spin current injected from the spin injection source 502 to the ferromagnet 501. The ferromagnet 501 functions as a magnetization free layer. The magnetization of the ferromagnet 501 can precess due to the spin current injected from the spin injection source 502. Furthermore, a frequency or an amplitude of the precession can be changed by applying an external magnetic field (in-plane bias magnetic field) in parallel with the axis of hard magnetization of the ferromagnet 501.

The ferromagnet 501 contains at least one of Co, Fe, Ni, Mn, B, Si, Zr, Nb, Ta, Ru, Ir, Pt, Ga, Al, Pd, Tb, and Gd. The ferromagnet 501 may be a layer stack including multiple layers.

The spin injection source 502 contains an HHA-TSM. As the HHA-TSM, for example, YPtBi is used.

One end of the magnetization driving transistor 503 is coupled to one end of the HHA-TSM (the spin injection source 502), and the other end of the magnetization driving transistor 503 is coupled to, for example, a power supply (not shown). A control signal is input to the gate of the magnetization driving transistor 503. The other end of the HHA-TSM opposite to the one end of the HHA-TSM (the spin injection source 502), to which the magnetization driving transistor 503 is coupled, is grounded.

In the case of operating the spin Hall oscillator 500 as an oscillator, the magnetization driving transistor 503 is set to an ON state. The in-plane current is supplied from one end of the spin injection source 502 to the other end, which is grounded, through the magnetization driving transistor 503 in the ON state. Upon flow of the in-plane current through the HHA-TSM (the spin injection source 502), a spin current is injected to the ferromagnet 501. As a result, the magnetization of the ferromagnet 501 processes. The precession of the magnetization of the ferromagnet 501 is externally output as a stray magnetic field arising from the magnetization.

3.3 Third Example

Figure 19:
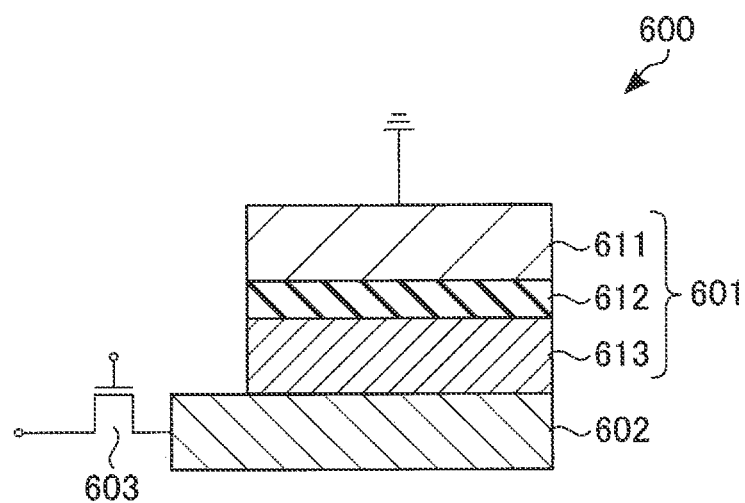
FIG. 19 is a schematic diagram showing an example of a spin Hall oscillator of two-terminal type according to a third example of the third embodiment.

A third example will be explained. In the explanation of the third example, a spin Hall oscillator of two-terminal type different from the second example will be explained with reference to FIG. 19. FIG. 19 is a schematic diagram showing an example of a spin Hall oscillator of two-terminal type.

As illustrated in FIG. 19, a spin Hall oscillator 600 of two-terminal type includes an MTJ element 601, a spin injection source 602, and a magnetization driving transistor 603.

The configuration of the MTJ element 601 is similar to that of the MTJ element 401 of the first example. More specifically, the MTJ element 601 includes a ferromagnet 611, an insulator 612, and a ferromagnet 613. For example, the ferromagnet 613, the insulator 612, and the ferromagnet 611 are stacked in this order on the spin injection source 602. The ferromagnet 611, similarly to the ferromagnet 411, functions as a magnetization fixed layer. Unlike in the first example, the ferromagnet 611 is grounded. The insulator 612, similarly to the insulator 412, functions as a tunnel barrier layer. The ferromagnet 613, similarly to the ferromagnet 413, functions as a magnetization free layer.

The spin injection source 602 contains an HHA-TSM. As the HHA-TSM, for example, YPtBi is used.

One end of the magnetization driving transistor 603 is coupled to one end of the HHA-TSM (the spin injection source 602), and the other end of the magnetization driving transistor 603 is coupled to, for example, a power supply (not shown). A control signal is input to the gate of the magnetization driving transistor 603.

In the case of operating the spin Hall oscillator 600 as an oscillator, the magnetization driving transistor 603 is set to an ON state. A current flows from the spin injection source 602 to the ferromagnet 611 through the magnetization driving transistor 603 in the ON state. Upon flow of the in-plane current through the HHA-TSM (the spin injection source 602), a spin current is injected to the ferromagnet 613. As a result, the magnetization of the ferromagnet 613 processes. Since the current input via the magnetization driving transistor 603 flows through the MTJ element 601, the magnetization direction of the ferromagnet 613 can be electrically detected by a TMR effect that occurs in the MTJ terminal 601. Accordingly, the precession of the magnetization of the ferromagnet 613 is converted to an electric signal due to the TMR effect of the MTJ element 601. Then, the electric signal is output as an alternating voltage from a voltage output terminal (not shown) coupled to the spin injection source 602.

3.4 Fourth Example

Figure 20:
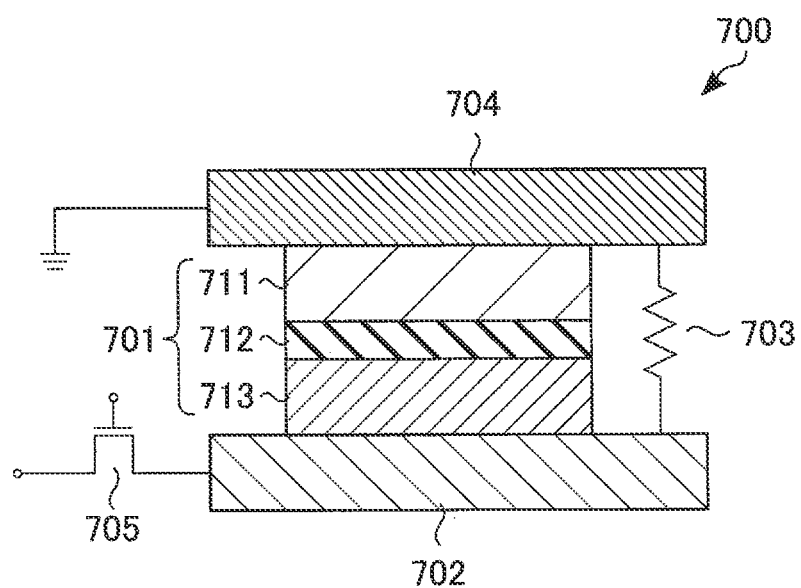
FIG. 20 is a schematic diagram showing an example of a spin Hall oscillator of two-terminal type according to a fourth example of the third embodiment.

A fourth example will be explained. In the explanation of the fourth example, a spin Hall oscillator of two-terminal type including an MTJ element and a parallel resistance will be explained with reference to FIG. 20. FIG. 20 is a schematic diagram showing an example of a spin Hall oscillator of two-terminal type.

As illustrated in FIG. 20, a spin Hall oscillator 700 of two-terminal type includes an MTJ element 701, a spin injection source 702, a resistance element 703, a conductor 704, and a magnetization driving transistor 705.

The configuration of the MTJ element 701 is similar to that of the MTJ element 401 of the first example. More specifically, the MTJ element 701 includes a ferromagnet 711, an insulator 712, and a ferromagnet 713. For example, the ferromagnet 713, the insulator 712, and the ferromagnet 711 are stacked in this order on the spin injection source 702. The ferromagnet 711, similarly to the ferromagnet 411, functions as a magnetization fixed layer. The insulator 712, similarly to the insulator 412, functions as a tunnel barrier layer. The ferromagnet 713, similarly to the ferromagnet 413, functions as a magnetization free layer.

The spin injection source 702 contains an HHA-TSM. As the HHA-TSM, for example, YPtBi is used.

The resistance element 703 is arranged in parallel with the MTJ element 701. One end of the resistance element 703 is in contact with the spin injection source 702. The resistance value of the resistance element 703 is, for example, lower than that of the MTJ element 701.

The conductor 704 is coupled to the ferromagnet 711 of the MTJ element 701 and the other end of the resistance element 703. The conductor 704 is grounded. Thus, the ferromagnet 711 and the other end of the resistance element 703 are grounded. The conductor 704 contains a conductive material.

One end of the magnetization driving transistor 705 is coupled to one end of the HHA-TSM (the spin injection source 702), and the other end of the magnetization driving transistor 705 is coupled to, for example, a power supply (not shown). A control signal is input to the gate of the magnetization driving transistor 705.

In the case of operating the spin Hall oscillator 700 as an oscillator, the magnetization driving transistor 705 is set to an ON state. A current flows from the spin injection source 702 to the ferromagnet 704 through the magnetization driving transistor 705 in the ON state. Upon flow of the in-plane current through the HHA-TSM (the spin injection source 702), a spin current is injected to the ferromagnet 713. As a result, the magnetization of the ferromagnet 713 processes. The current input via the magnetization driving transistor 705 flows through the MTJ element 701 and the resistance element 703 to the conductor 704. Since the resistance value of the resistance element 703 is lower than that of the MTJ element 701, the in-plane current of the HHA-TSM mostly flows through the resistance element 703 to the conductor 704. Therefore, the magnitude of the in-plane current can be controlled in accordance with the magnitude of the resistance value of the resistance element 703. Part of the current injected via the magnetization driving transistor 705 flows through the MTJ element 701. Therefore, the magnetization direction of the ferromagnet 713 can be electrically detected by a TMR effect of the MTJ terminal 701. Accordingly, the precession of the magnetization of the ferromagnet 713 is converted to an electric signal due to the TMR effect of the MTJ element 701. Then, the electric signal is output as an alternating voltage from a voltage output terminal (not shown) coupled to the spin injection source 702.

3.5 Advantages of Embodiment

With the configuration of this embodiment, an HHA-TSM can be applied to a spin Hall oscillator.

4. Fourth Embodiment

Next, a fourth embodiment will be explained. In the explanation of the fourth embodiment, a case where a spin Hall oscillator that includes a spin injection source containing an HHA-TSM is applied to an artificial neuron of an artificial neuron computer will be explained. Hereinafter, differences from the first to third embodiments will be mainly described.

4.1 Configuration of Artificial Neuron

Figure 21:
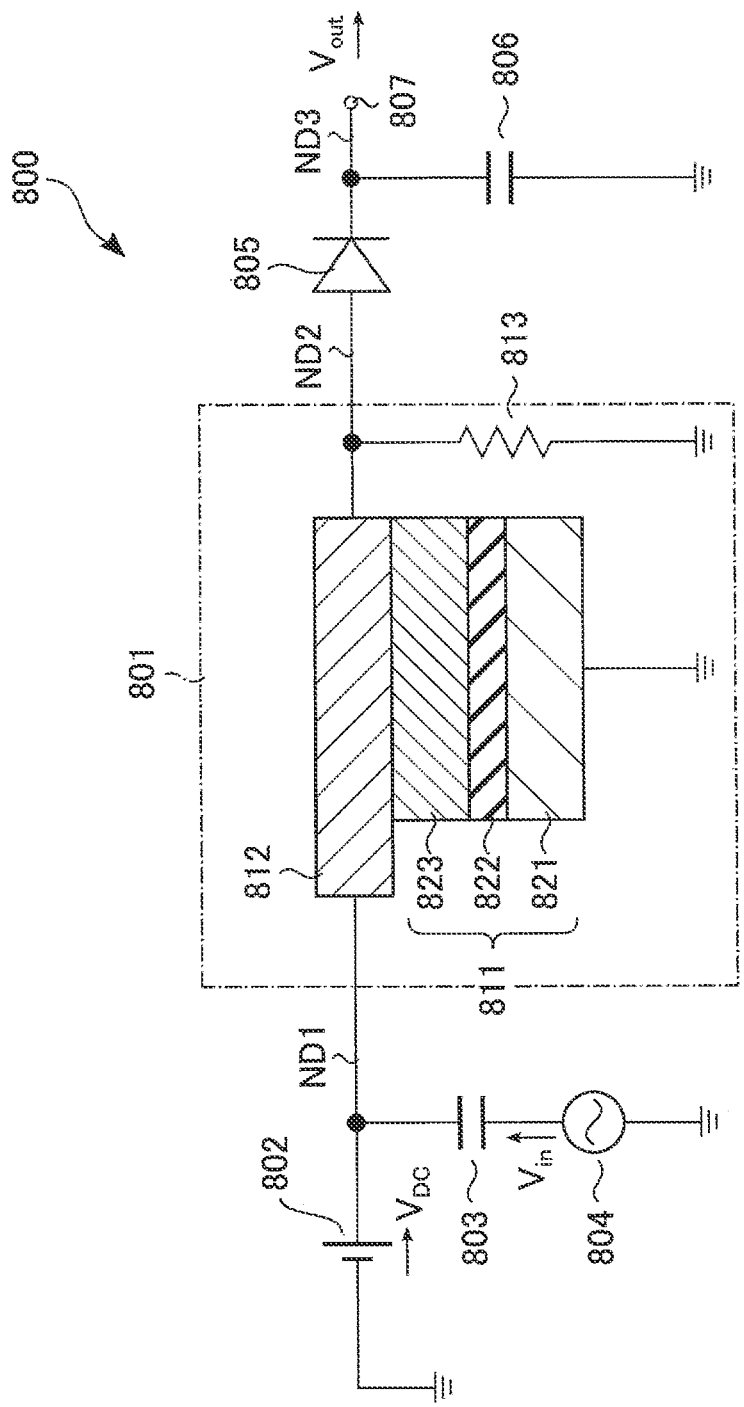
FIG. 21 is a schematic diagram showing an example of an artificial neuron using a spin Hall oscillator according to a fourth embodiment.

A configuration of an artificial neuron will be explained with reference to FIG. 21. FIG. 21 is a schematic diagram showing an example of an artificial neuron using a spin Hall oscillator.

As illustrated in FIG. 21, an artificial neuron 800 includes a spin Hall oscillator 801, a DC power supply 802, an input capacitor 803, an AC power supply 804, a diode 805, an output capacitor 806, and an output terminal 807.

The spin Hall oscillator 801 includes an MTJ element 811, a spin injection source 812, and a resistance element 813.

The configuration of the MTJ element 811 is similar to that of the MTJ element 401 of the first example of the third embodiment. More specifically, the MTJ element 811 includes a ferromagnet 821, an insulator 822, and a ferromagnet 823. For example, the ferromagnet 823, the insulator 822, and the ferromagnet 821 are stacked in this order on the spin injection source 812. The ferromagnet 821, similarly to the ferromagnet 411, functions as a magnetization fixed layer. The ferromagnet 821 is grounded. The insulator 822, similarly to the insulator 412, functions as a tunnel barrier layer. The ferromagnet 823, similarly to the ferromagnet 413, functions as a magnetization free layer. Alternatively, the ferromagnet 821 may function as a magnetization free layer, and the ferromagnet 823 may function as a magnetization fixed layer.

The spin injection source 812 contains an HHA-TSM. As the HHA-TSM, for example, YPtBi is used. One end of the HHA-TSM is coupled to a node ND1, and the other end thereof is coupled to a node ND2.

The resistance element 813 is arranged in parallel with the MTJ element 811. One end of the resistance element 813 is coupled to the node ND2. In other words, the one end of the resistance element 813 is coupled to the spin injection source 812 via the node ND2. The other end of the resistance element 813 is grounded. The resistance value of the resistance element 813 is, for example, lower than that of the MTJ element 811. The resistance element 813 may be omitted.

The DC power supply 802 is coupled to one end of the HHA-TSM (the spin injection source 812) via the node ND1. The DC power supply 802 applies a bias DC voltage $V_{DC}$ to the HHA-TSM via the node ND1.

One electrode of the input capacitor 803 is coupled to the node ND1, and the other electrode thereof is coupled to the AC power supply 804.

The AC power supply 804 applies an input signal $V_{in}$ to the node ND1 via the input capacitor 803. A composite voltage of the bias DC voltage $V_{DC}$ and the input signal $V_{in}$ is applied to the HHA-TSM. For example, the input signal $V_{in}$ is a voltage signal obtained by sampling a time-base input signal from a voice or a sensor, and multiplying the sampled signal by a random matrix (mask data).

One end of the diode 805 is coupled to the node ND2, and the other end thereof is coupled to the node ND3. The diode 805 is arranged so as to apply a forward bias from the node ND2 toward the node ND3.

One electrode of the output capacitor 806 is coupled to the node ND3 and the other electrode thereof is grounded.

The output terminal 807 is coupled to the node ND3. An output voltage $V_{out}$ is output from the output terminal 807.

In the artificial neuron 800, for example, in response to application of a composite voltage of the bias DC voltage $V_{DC}$ and the input signal $V_{in}$ to the HHA-TSM, an in-plane current flows through the HHA-TSM. By the in-plane current, a spin current is injected from the HHA-TSM to the ferromagnet 823, and the magnetization of the ferromagnet 823 processes. The precession is output as an alternating voltage via the MTJ element 811. Furthermore, the alternating voltage of the MTJ element 811 is smoothed by the diode 805 and the output capacitor 806, and output as an output voltage $V_{out}$ of the artificial neuron 800. Since the output from the spin Hall oscillator 801 changes nonlinearly with respect to the input signal $V_{in}$, the output voltage $V_{out}$ of the artificial neuron 800 also changes nonlinearly with respect to the input signal $V_{in}$. Therefore, by using the output voltage $V_{out}$ of the artificial neuron 800 as an input signal of another artificial neuron or a new input signal of itself, the artificial neuron can be used for an artificial neuron computer.

4.2 Advantages of Embodiment

With the configuration of this embodiment, an HHA-TSM can be applied to an artificial neuron of an artificial neuron computer.

The spin Hall oscillator according to any of the first to fourth examples of the third embodiment is applicable to the spin Hall oscillator 801 for use in an artificial neuron.

5. Fifth Embodiment

Next, a fifth embodiment will be explained. In the explanation of the fifth embodiment, a case where an HHA-TSM is used in a detection layer of a magnetic sensor. Hereinafter, differences from the first to fourth embodiments will be mainly explained.

5.1 Configuration of Magnetic Sensor

Figure 22:
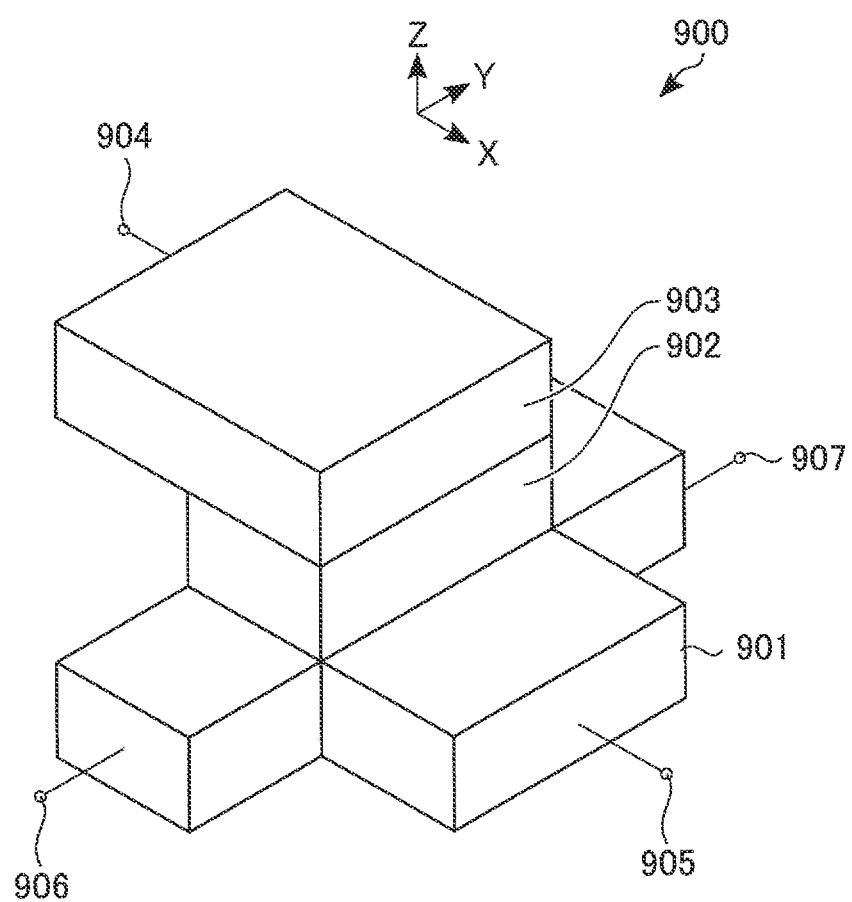
FIG. 22 is a schematic diagram showing an example of a magnetic sensor according to a fifth embodiment.

An example of a configuration of a magnetic sensor will be explained with reference to FIG. 22. FIG. 22 shows an example of a magnetic sensor.

As illustrated in FIG. 22, a magnetic sensor 900 includes a detection layer 901, a ferromagnet 902, a conductor 903, current terminals 904 and 905, and voltage terminals 906 and 907. In the explanation below, a direction which is parallel to a film surface of the detection layer 901 in which a current flows via the current terminals 904 and 905 is defined as an X direction. A direction parallel to the film surface of the detection layer 901 and intersecting the X direction is defined as a Y direction. A direction perpendicular to the film surface of the detection layer 901 is defined as a Z direction.

The detection layer 901 contains an HHA-TSM. As the HHA-TSM, for example, YPtBi is used.

The ferromagnet 902 is provided on the detection layer 901 in the Z direction. The ferromagnet 902 has ferromagnetic properties, and has an axis of easy magnetization in a direction (in-plane direction) parallel to the film surface that is in contact with the detection layer 901. The ferromagnet 902 contains at least one of Co, Fe, Ni, Mn, B, Si, Zr, Nb, Ta, Ru, Ir, Pt, Ga, Al, Pd, Tb, and Gd. The ferromagnet 902 may be a layer stack including multiple layers.

Between the detection layer 901 and the ferromagnet 902, an intermediate layer having an interface in contact with the detection layer 901 and the ferromagnet 902 may be interposed. A nonmagnetic metal or a metal oxide containing at least one of Ga, Al, Mg, Hf, and Zr may be used as the intermediate layer.

The conductor 903 is provided on the ferromagnet 902 in the Z direction. The conductor 903 contains a conductive material.

The current terminal 904 is coupled to an end of the conductor 903 facing in the X direction.

The current terminal 905 is coupled to an end of the detection layer 901 facing in the X direction. For example, a current supplied to the current terminal 904 flows through the conductor 903, the ferromagnet 902, and the detection layer 901 to the current terminal 905.

The voltage terminal 906 is coupled to one end of the detection layer 901 facing in the Y direction.

The voltage terminal 907 is coupled to the other end of the detection layer 901 facing in the Y direction.

A direct current is applied across the current terminal 904 and the current terminal 905 of the magnetic sensor 900. While the direct current penetrates (passes through) the ferromagnet 902 in a direction perpendicular to the film surface (in the Z direction), the direct current is converted by a spin filtering effect of the ferromagnet 902 to a spin polarized current having a spin quantization axis parallel to the magnetization direction of the ferromagnet 902. As a result, the spin polarized current is injected from the ferromagnet 902 to the HHA-TSM (the detection layer 901) in the Z direction perpendicular to the film surface. In the HHA-TSM, the spin polarized current is converted to a charge current by an inverse spin Hall effect of the HHA-TSM. Part of the converted current produces an electromotive force between the voltage terminal 906 and the voltage terminal 907. The magnitude of the electromotive force produced between the voltage terminal 906 and the voltage terminal 907 is proportional to an X direction component of the magnetization of the ferromagnet 902. The electromotive force produced between the voltage terminal 906 and the voltage terminal 907 by the inverse spin Hall effect in the HHA-TSM is changed, as the X direction component of the magnetization of the ferromagnet 902 is changed by an external magnetic field. Therefore, the external magnetic field can be estimated from the amount of change of the electromotive force.

5.2 Advantages of Embodiment

With the configuration of this embodiment, an HHA-TSM can be applied to a magnetic sensor.

6. Others

In the above embodiments, a spin injection source, a magnetic memory, a spin Hall oscillator, an artificial neuron computer, and a magnetic memory which use an HHA-TSM have been explained. However, the embodiments are not limited thereto. The HHA-TSM is applicable to other products using a spin Hall material. For example, microwaves generated from the spin Hall oscillator of the third embodiment described above may be utilized to assist recording in a magnetic recording device.

The embodiments described above may be combined as far as possible.

For example, a plurality of spin Hall oscillator structures which are the same as that of one or more of the spin Hall oscillators according to the first to fourth examples of the third embodiment may be electrically or magnetically combined and synchronized to constitute one spin Hall oscillator.

Furthermore, the term "couple" used in the description of the embodiments encompasses various states, including indirect coupling between elements where, for example, other components such as transistors, resistors, etc., are interposed between the elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A spin injection source comprising
   YPtBi that is a non-magnetic half Heusler alloy-topological semi-metal, has a spin Hall angle exceeding 1, has a surface state of Dirac type, and is in contact with a ferromagnet,
   wherein the YPtBi supplies a spin current to the ferromagnet based on a current flowing in a direction parallel to a first surface that is in contact with the ferromagnet.

2. The spin injection source according to claim 1, wherein the YPtBi has a (111) crystal plane.

3. The spin injection source according to claim 1, wherein a heat resistance of the YPtBi is equal to or higher than 300° C. and equal to or lower than 600° C.

4. A magnetic memory comprising:
   a spin injection source containing YPtBi that is a non-magnetic half Heusler alloy-topological semi-metal, has a spin Hall angle exceeding 1, and has a surface state of Dirac type; and
   a magnetic memory element including a first ferromagnet that is in contact with the spin injection source, a second ferromagnet, and an insulator interposed between the first ferromagnet and the second ferromagnet,
   wherein:
   the YPtBi supplies a spin current to the first ferromagnet based on a current flowing in a direction parallel to a first surface that is in contact with the first ferromagnet, and
   the first ferromagnet is magnetization-reversible by the spin current.

5. The magnetic memory according to claim 4, wherein the current flows from the spin injection source to the second ferromagnet.

6. The magnetic memory according to claim 4, wherein:
   the YPtBi supplies to the first ferromagnet the spin current that is generated by a spin Hall effect arising from the surface state of Dirac type, and
   a magnetization direction of the first ferromagnet is controlled by an anti-damping torque generated by injection of the spin current.

7. The magnetic memory according to claim 4, wherein the first ferromagnet contains at least one of Co, Fe, Ni, Mn, B, Si, Zr, Nb, Ta, Ru, Ir, Pt, Ga, Al, Pd, Tb, and Gd.

8. The magnetic memory according to claim 4, wherein the second ferromagnet contains at least one of Co, Fe, Ni, Mn, B, Si, Zr, Nb, Ta, Ru, Ir, Pt, Ga, Al, Pd, Tb, and Gd.

9. The magnetic memory according to claim 4, wherein the insulator is a metal oxide that is nonmagnetic and contains at least one of Ga, Al, Mg, Hf, and Zr.

10. The magnetic memory according to claim 4, wherein the YPtBi has a (111) crystal plane.

11. The magnetic memory according to claim 4, wherein a heat resistance of the YPtBi is equal to or higher than 300° C. and equal to or lower than 600° C.

12. A magnetic memory comprising:
a spin injection source containing YPtBi that is a non-magnetic half Heusler alloy-topological semi-metal, has a spin Hall angle exceeding 1, and has a surface state of Dirac type;
a first ferromagnet that is in contact with the spin injection source and includes a plurality of magnetic domains, the plurality of magnetic domains including a first magnetic domain;
a first conductor that is coupled to one end of at least one of the first ferromagnet and the spin injection source;
a second conductor that is coupled to the other end of at least the one of the first ferromagnet and the spin injection source;
a third conductor that is provided between the first conductor and the second conductor and that is coupled to at least one of the first ferromagnet and the spin injection source;
a second ferromagnet that is provided between the first conductor and the third conductor; and
an insulator interposed between the first magnetic domain of the first ferromagnet and the second ferromagnet, wherein:
in a case of controlling a magnetization direction of the first magnetic domain, the YPtBi supplies a spin current to the first magnetic domain based on a current flowing between the first conductor and the third conductor in a direction parallel to a first surface that is in contact with the first ferromagnet, and
in a case of moving the plurality of magnetic domains of the first ferromagnet, a voltage is applied across the first conductor and the second conductor.

13. The magnetic memory according to claim 12, wherein;
the YPtBi supplies to the first ferromagnet the spin current that is generated by a spin Hall effect arising from the surface state of Dirac type, and
magnetization direction of the first ferromagnet is controlled by an anti-damping torque generated by injection of the spin current.

14. The magnetic memory according to claim 12, wherein the first ferromagnet contains at least one of Co, Fe, Ni, Mn, B, Si, Zr, Nb, Ta, Ru, Ir, Pt, Ga, Al, Pd, Tb, and Gd.

15. The magnetic memory according to claim 12, wherein the second ferromagnet contains at least one of Co, Fe, Ni, Mn, B, Si, Zr, Nb, Ta, Ru, Ir, Pt, Ga, Al, Pd, Tb, and Gd.

16. The magnetic memory according to claim 12, wherein the insulator is a metal oxide that is nonmagnetic and contains at least one of Ga, Al, Mg, Hf, and Zr.

17. The magnetic memory according to claim 12, wherein the YPtBi has a (111) crystal plane.

18. The magnetic memory according to claim 12, wherein a heat resistance of the YPtBi is equal to or higher than 300° C. and equal to or lower than 600° C.

19. A spin Hall oscillator comprising:
a spin injection source containing YPtBi that is a non-magnetic half Heusler alloy-topological semi-metal, has a spin Hall angle exceeding 1, and has a surface state of Dirac type; and
a first ferromagnet that is in contact with the spin injection source,
wherein the first ferromagnet oscillates upon receipt of a spin current generated by a spin Hall effect of the YPtBi and injected from the spin injection source.

20. The spin Hall oscillator according to claim 19, further comprising:
a second ferromagnet; and
an insulator interposed between the first ferromagnet and the second ferromagnet.

21. The spin Hall oscillator according to claim 20, further comprising:
a conductor that is in contact with the second ferromagnet; and
a resistance element one end of which is coupled to the YPtBi and another end of which is coupled to the conductor.

22. The spin Hall oscillator according to claim 20, wherein the second ferromagnet contains at least one of Co, Fe, Ni, Mn, B, Si, Zr, Nb, Ta, Ru, Ir, Pt, Ga, Al, Pd, Tb, and Gd.

23. The spin Hall oscillator according to claim 20, wherein the insulator is a metal oxide that contains at least one of Ga, Al, Mg, Hf, and Zr.

24. The spin Hall oscillator according to claim 19, wherein the first ferromagnet contains at least one of Co, Fe, Ni, Mn, B, Si, Zr, Nb, Ta, Ru, Ir, Pt, Ga, Al, Pd, Tb, and Gd.

25. The spin Hall oscillator according to claim 19, wherein the YPtBi has a (111) crystal plane.

26. The spin Hall oscillator according to claim 19, wherein a heat resistance of the YPtBi is equal to or higher than 300° C. and equal to or lower than 600° C.

27. A computer comprising an artificial neuron including a spin Hall oscillator, wherein:
the spin Hall oscillator includes:
a spin injection source containing YPtBi that is a non-magnetic half Heusler alloy-topological semi-metal, has a spin Hall angle exceeding 1, and has a surface state of Dirac type; and
a first ferromagnet that is in contact with the spin injection source, and
the first ferromagnet oscillates upon receipt of a spin current generated by a spin Hall effect of the YPtBi and injected from the spin injection source.

28. The computer according to claim 27, wherein the YPtBi has a (111) crystal plane.

29. The computer according to claim 27, wherein a heat resistance of the YPtBi is equal to or higher than 300° C. and equal to or lower than 600° C.

30. A magnetic sensor comprising:
a detection layer including YPtBi that is a non-magnetic half Heusler alloy-topological semi-metal, has a spin Hall angle exceeding 1, and has a surface state of Dirac type; and
a ferromagnet that is in contact with the detection layer and has a magnetization directed in an in-plane direction of a first surface that is in contact with the detection layer.

31. The magnetic sensor according to claim 30, wherein by causing a current to flow in a direction perpendicular to the first surface in the ferromagnet, thereby injecting a spin polarized current to the YPtBi, a voltage depending on a direction of the magnetization of the ferromagnet is generated by an inverse spin Hall effect of the YPtBi.

32. The magnetic sensor according to claim 30, wherein the ferromagnet contains at least one of Co, Fe, Ni, Mn, B, Si, Zr, Nb, Ta, Ru, Ir, Pt, Ga, Al, Pd, Tb, and Gd.

33. The magnetic sensor according to claim 30, wherein the YPtBi has a (111) crystal plane.

34. The magnetic sensor according to claim 30, wherein a heat resistance of the YPtBi is equal to or higher than 300° C. and equal to or lower than 600° C.

* * * * *